(12) United States Patent
Smith et al.

(10) Patent No.: US 7,709,859 B2
(45) Date of Patent: May 4, 2010

(54) CAP LAYERS INCLUDING ALUMINUM NITRIDE FOR NITRIDE-BASED TRANSISTORS

(75) Inventors: Richard Peter Smith, Carrboro, NC (US); Adam William Saxler, Durham, NC (US); Scott T. Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 192 days.

(21) Appl. No.: 11/684,747

(22) Filed: Mar. 12, 2007

(65) Prior Publication Data
US 2007/0164315 A1   Jul. 19, 2007

Related U.S. Application Data

(63) Continuation-in-part of application No. 10/996,249, filed on Nov. 23, 2004, now Pat. No. 7,456,443.

(51) Int. Cl.
*H01L 29/84* (2006.01)
*H01L 21/338* (2006.01)

(52) U.S. Cl. .................. 257/194; 257/219; 257/243; 438/167

(58) Field of Classification Search .............. 257/194, 257/219, 243; 438/167
See application file for complete search history.

(56) References Cited

U.S. PATENT DOCUMENTS

| | | | |
|---|---|---|---|
| 4,424,525 A | 1/1984 | Mimura | |
| 4,471,366 A | 9/1984 | Delagebeaudeuf et al. | |
| 4,727,403 A | 2/1988 | Hida et al. | |
| 4,755,867 A | 7/1988 | Cheng | |
| 4,788,156 A | 11/1988 | Stoneham et al. | |
| 4,946,547 A | 8/1990 | Palmour et al. | |

(Continued)

FOREIGN PATENT DOCUMENTS

EP    0 334 006 A1    9/1989

(Continued)

OTHER PUBLICATIONS

Bathe, R. et al., "BN protective coating for high temperature applications," Surface Engineering 2001—Fundamentals and Applications. Symposium (*Mater. Res. Soc. Symposium Proceedings* vol. 697) Mater. Res. Soc. Warrendale, PA, USA, 2001, p. 61-66.

(Continued)

*Primary Examiner*—Howard Weiss
*Assistant Examiner*—Steven H Rao
(74) *Attorney, Agent, or Firm*—Myers Bigel Sibley & Sajovec

(57) ABSTRACT

High electron mobility transistors are provided that include a non-uniform aluminum concentration AlGaN based cap layer having a high aluminum concentration adjacent a surface of the cap layer that is remote from the barrier layer on which the cap layer is provided. High electron mobility transistors are provided that include a cap layer having a doped region adjacent a surface of the cap layer that is remote from the barrier layer on which the cap layer is provided. Graphitic BN passivation structures for wide bandgap semiconductor devices are provided. SiC passivation structures for Group III-nitride semiconductor devices are provided. Oxygen anneals of passivation structures are also provided. Ohmic contacts without a recess are also provided.

18 Claims, 9 Drawing Sheets

U.S. PATENT DOCUMENTS

| | | | |
|---|---|---|---|
| 5,053,348 | A | 10/1991 | Mishra et al. |
| 5,172,197 | A | 12/1992 | Nguyen et al. |
| 5,192,987 | A | 3/1993 | Khan et al. |
| 5,200,022 | A | 4/1993 | Kong et al. |
| 5,210,051 | A | 5/1993 | Carter, Jr. |
| 5,296,395 | A | 3/1994 | Khan et al. |
| 5,298,445 | A | 3/1994 | Asano |
| RE34,861 | E | 2/1995 | Davis et al. |
| 5,389,571 | A | 2/1995 | Takeuchi et al. |
| 5,393,993 | A | 2/1995 | Edmond et al. |
| 5,523,589 | A | 6/1996 | Edmond et al. |
| 5,534,462 | A | 7/1996 | Fiordalice et al. |
| 5,592,501 | A | 1/1997 | Edmond et al. |
| 5,686,737 | A | 11/1997 | Allen |
| 5,700,714 | A | 12/1997 | Ogihara et al. |
| 5,701,019 | A | 12/1997 | Matsumoto et al. |
| 5,705,827 | A | 1/1998 | Baba et al. |
| 5,804,482 | A | 9/1998 | Konstantinov et al. |
| 5,885,860 | A | 3/1999 | Weitzel et al. |
| 5,946,547 | A | 8/1999 | Kim et al. |
| 5,990,531 | A | 11/1999 | Taskar et al. |
| 6,028,328 | A | 2/2000 | Riechert et al. |
| 6,046,464 | A | 4/2000 | Schetzina |
| 6,051,849 | A | 4/2000 | Davis et al. |
| 6,064,082 | A | 5/2000 | Kawai et al. |
| 6,086,673 | A | 7/2000 | Molnar |
| 6,150,680 | A | 11/2000 | Eastman et al. |
| 6,177,685 | B1 | 1/2001 | Teraguchi et al. |
| 6,177,688 | B1 | 1/2001 | Linthicum et al. |
| 6,218,680 | B1 | 4/2001 | Carter, Jr. et al. |
| 6,255,198 | B1 | 7/2001 | Linthicum et al. |
| 6,261,929 | B1 | 7/2001 | Gehrke et al. |
| 6,316,793 | B1 | 11/2001 | Sheppard et al. |
| 6,376,339 | B2 | 4/2002 | Linthicum et al. |
| 6,380,108 | B1 | 4/2002 | Linthicum et al. |
| 6,429,467 | B1 | 8/2002 | Ando |
| 6,448,648 | B1 | 9/2002 | Boos |
| 6,462,355 | B1 | 10/2002 | Linthicum et al. |
| 6,486,042 | B2 | 11/2002 | Gehrke et al. |
| 6,489,221 | B2 | 12/2002 | Gehrke et al. |
| 6,492,669 | B2 | 12/2002 | Nakayama et al. |
| 6,498,111 | B1 | 12/2002 | Kapolnek et al. |
| 6,515,316 | B1 | 2/2003 | Wojtowicz et al. |
| 6,521,514 | B1 | 2/2003 | Gehrke et al. |
| 6,545,300 | B2 | 4/2003 | Gehrke et al. |
| 6,548,333 | B2 | 4/2003 | Smith |
| 6,570,192 | B1 | 5/2003 | Davis et al. |
| 6,582,906 | B1 | 6/2003 | Cao et al. |
| 6,582,986 | B2 | 6/2003 | Kong et al. |
| 6,586,778 | B2 | 7/2003 | Linthicum et al. |
| 6,586,781 | B2 | 7/2003 | Wu et al. |
| 6,602,763 | B2 | 8/2003 | Davis et al. |
| 6,602,764 | B2 | 8/2003 | Linthicum et al. |
| 6,608,327 | B1 | 8/2003 | Davis et al. |
| 6,621,148 | B2 | 9/2003 | Linthicum et al. |
| 6,639,255 | B2 | 10/2003 | Inoue et al. |
| 6,686,261 | B2 | 2/2004 | Gehrke et al. |
| 6,706,114 | B2 | 3/2004 | Mueller |
| 6,841,410 | B2 | 1/2005 | Sasaoko |
| 7,084,441 | B2 | 8/2006 | Saxler |
| 7,170,111 | B2 | 1/2007 | Saxler |
| 2001/0015446 | A1 | 8/2001 | Inoue et al. |
| 2001/0020700 | A1 | 9/2001 | Inoue et al. |
| 2001/0023964 | A1 | 9/2001 | Wu et al. |
| 2001/0040246 | A1 | 11/2001 | Ishii |
| 2002/0008241 | A1 | 1/2002 | Edmond et al. |
| 2002/0017648 | A1 | 2/2002 | Kasahara et al. |
| 2002/0017696 | A1 | 2/2002 | Nakayama et al. |
| 2002/0066908 | A1 | 6/2002 | Smith |
| 2002/0079508 | A1 | 6/2002 | Yoshida |
| 2002/0119610 | A1 | 8/2002 | Nishii et al. |
| 2002/0167023 | A1 | 11/2002 | Chavarkar et al. |
| 2003/0017683 | A1 | 1/2003 | Emrick et al. |
| 2003/0020092 | A1 | 1/2003 | Parikh et al. |
| 2003/0042496 | A1 | 3/2003 | Sasaoko |
| 2003/0102482 | A1 | 6/2003 | Saxler |
| 2003/0107065 | A1 | 6/2003 | Taniguchi et al. |
| 2003/0123829 | A1 | 7/2003 | Taylor |
| 2003/0145784 | A1 | 8/2003 | Thompson et al. |
| 2003/0157776 | A1 | 8/2003 | Smith |
| 2003/0213975 | A1 | 11/2003 | Hirose et al. |
| 2004/0004223 | A1 | 1/2004 | Nagahama et al. |
| 2004/0012015 | A1 | 1/2004 | Saxler |
| 2004/0021152 | A1 | 2/2004 | Nguyen et al. |
| 2004/0029330 | A1 | 2/2004 | Hussain et al. |
| 2004/0061129 | A1 | 4/2004 | Saxler et al. |
| 2004/0173788 | A1 | 9/2004 | Takizawa |
| 2004/0241970 | A1 | 12/2004 | Ring |
| 2005/0258451 | A1 | 11/2005 | Saxler et al. |
| 2006/0019435 | A1 | 1/2006 | Sheppard et al. |
| 2007/0018199 | A1 | 1/2007 | Sheppard et al. |

FOREIGN PATENT DOCUMENTS

| | | |
|---|---|---|
| EP | 0 563 847 A2 | 10/1993 |
| JP | 10-050982 | 2/1998 |
| JP | 11261053 | 9/1999 |
| JP | 2001230407 A | 8/2001 |
| JP | 2002016087 A | 1/2002 |
| JP | 2004-342810 | 12/2004 |
| WO | WO 93/23877 A1 | 11/1993 |
| WO | WO 00/04587 A3 | 1/2000 |
| WO | WO 01/57929 A1 | 8/2001 |
| WO | WO 03/007383 A2 | 1/2003 |
| WO | WO 03/049193 A1 | 6/2003 |
| WO | WO 03/050849 A2 | 6/2003 |
| WO | WO 2004/008495 | 1/2004 |
| WO | WO 2004/008495 A2 | 1/2004 |

OTHER PUBLICATIONS

Guarnieri, C.R. et al., "Amorphous Sic Films for Passivation Applications," *IBM Technical Disclosure Bulletin*, vol. 23, No. 6, Nov. 1980, p. 2509.

Han, W.Y. et al., "Hydrogen Effects on Heavily Carbon-Doped GaAs," *Proceedings of the Symposium on High Speed III-V Electronics for Wireless Applications and the Twenth-fifth State-of-the-Art Program on Compound Semiconductors* (SOTAPOCS XXV) Electrochem. Soc., Pennington, NJ, USA, 1996, p. 309-315.

International Search Report and Written Opinion from the International Searching Authority for International Application No. PCT/US2005/031272, mailed May 18, 2006.

Phillip, M. et al., "Optimization of Preparation of Epitaxial β-SiC Layers Formed by Fullerene-Carbonization of Silicon," *Proceedings of the International Winterschool on Electronic Properties of Novel Materials. Fullerenes and Fullerene Nanostructures* World Scientific Singapore, Singapore, 1996, p. 600-604.

Polyakov, A.Y. et al., "Deep traps in unpassivated and Sc2O3-passivated AlGaN/GaN high electron mobility transistors," *Applied Physics Letters*, vol. 83, No. 13, Sep. 29, 2003, p. 2608-2610.

Rangan, S. et al., "A Comparative Study of Anneal Efficiencies of Deuterium and Hydrogen in Plasma-Processed Transistors," ESSDERC'98. *Proceedings of the 28th European Solid-State Device Research Conference Editions Frontiers*. Paris, France, 1998, p. 564-567.

Invitation to Pay Additional Fees and Partial International Search Report from the International Searching Authority for International Application No. PCT/US2005/031272, mailed Jan. 25, 2006.

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

Ando et al., "10-W/mm AlGaN-GaN HFET With a Field Modulating Plate," *IEEE Electron Device Letters*, 24(5), pp. 289-291 (May 2003).

Asbeck et al. "Piezoelectric charge densities in AlGaN/GaN HFETs," *Elecronics Letters*. vol. 33, No. 14, pp. 1230-1231 (1997).

Beaumont, B. et al., "Epitaxial Lateral Overgrowth of GaN," *Phys. Stat. Sol.* (b) 227, No. 1, pp. 1-43 (2001).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETS," *Solid-State Electronics*. vol. 41, No. 2, pp. 247-250 (1997).

Burm et al. "Ultra-Low Resistive Ohmic Contacts on $n$-GaN Using Si Implantation," *Applied Physics Letters*. vol. 70, No. 4, 464-66 (1997).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chen et al. "C12 reactive ion etching for gate recessing of AlGaN/GaN field-effect transistors," *J. Vac. Sci. Technol. B*. vol. 17, No. 6, pp. 2755-2758 (1999).

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys*. 33:775-778 (1994).

Coffie et al., Unpassivated p-GaN/AlGaN/GaN HEMTs with 7.1 W/MMF at 10 GHz, *Electronic Letters online No. 20030872*, 39(19), (Sep. 18, 2003).

Eastman et al. "GaN materials for high power microwave amplifiers," *Mat. Res. Soc. Symp. Proc*. vol. 512 (1998).

Eastman at al. "Undoped AlGaN/GaN HEMTs for Microwave Power Amplification," *IEEE Transactions on Electron Devices*. vol. 48, No. 3, pp. 479-485 (Mar. 2001).

Egawa et al. "Recessed gate ALGaN/GaN MODFET on Sapphire Grown by MOCVD," *Applied Physics Letters*. vol. 76, No. 1, pp. 121-123 (Jan. 2000).

Gaska et al. "Electron Transport in AlGaN/GaN Heterostructures Grown on 6H-SiC Substrates," *Applied Physics Letters*. vol. 72, No. 6, pp. 707-709 (Feb. 1998).

Gaska et al. "High-Temperature Performance of AlGaN/GaN HFET's on SiC Substrates," *IEEE Electron Device Letters*. vol. 18, No. 1, pp. 492-494 (Oct. 1997).

Gaska et al., "Self-Heating in High-Power AlGaN/GaN HFET's," *IEEE Electron Device Letters*, 19(3), pp. 89-91 (Mar. 1998).

Gelmont et al. "Monte Carlo simulation of electron transport in gallium nitride," *Journal of Applied Physics*. vol. 74, No. 3, pp. 1818-1821 (Aug. 1993).

Heikman et al., "Growth of Fe-Doped Semi-insulating GaN by Metalorganic Chemical Vapor Deposition," *Applied Physics Letters*. vol. 83, No. 1, p. 439-441 (Jul. 2002).

Heikman, et al., "Mass Transport Regrowth of GaN for Ohmic Contacts to AlGaN/GaN," *Applied Physics Letters*. vol. 78, No. 19, pp. 2876.

Heikman et al. "Polarization Effects in AlGaN/GaN and GaN/AlGaN/GaN heterostructures", *Journal of Applied Physics*. vol. 93, No. 12, pp. 10114-10118 (Jun. 2003).

Heikman, Sten J., *MOCVD Growth Technologies for Applications in AlGaN/GaN High Electron Mobility Transistors*, Dissertation, University of California—Santa Barbara, Sep. 2002, 190 pages.

Kanaev et al., "Femtosecond and Ultraviolet Laser Irradiation of Graphitelike Hexagonal Boron Nitride," *Journal of Applied Physics*, 96(8) pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Karmalkar et al. "RESURF AlGaN/GaN HEMT for High Voltage Power Switching," *IEEE Electron Device Letters*. Vol. 22, No. 8, pp. 373-375 (Aug. 2001).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kasahara et al., "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters et al., "Double-Heterojunction Lattice-Matched and Pseudomorphic InGaAs HEMT with δ- Doped InP Supply Layers and p-InP Barier Enhancement Layer Grown by LP-MOVPE," *IEEE Electron Device Letters*, 14(1), (Jan. 1993).

Kuzmik et al. "Annealing of Schottky contacts deposited on dry etched AlGaN/Gan," *Semiconductor Science and Technology*. vol. 17, No. 11 (Nov. 2002).

Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Neuburger et al. "Design of GaN-based Field Effect Transistor Structures based on Doping Screening of Polarization Fields," WA 1.5, $7^{th}$ Wide-Gandgap III-Nitride Workshop (Mar. 2002).

Parikh et al. "Development of Gallium Nitride Epitaxy and Associated Material-Device Correlation for RF, Microwave and MM-wave Applications," Cree, Inc. (35 slides).

Ping et al. "DC and Microwave Performance of High-Current AlGaN/GaN Heterostructure Field Effect Transistors Grown on p-Type SiC Substrates," *IEEE Electron Device Letters*, vol. 19, No. 2, pp. 54-56 (Feb. 1998).

Saxler et al., "Ill-Nitride Heterostructures on High-Purity Semi-Insulating 4H-SiC Substrates for High-Power RF Transistors," International Workshop on Nitride Semiconductors (Jul. 19, 2004).

Sheppard et al. "High Power Demonstration at 10 GHz with GaN/AlGaN HEMT Hybrid Amplifiers." Presented at the $58^{th}$ DRC, Denver, CO, Jun. 2000.

Sheppard et al. "Improved 10-GHz Operation of GaN/AlGaN HEMTs on Silicon Carbide," *Materials Science Forum*. vols. 338-342, pp. 1643-1646, (2000).

Shen et al., "High-Power Polarization-Engineered GaN/AlGaN/GaN HEMTs Without Surface Passivation," *IEEE Electronics Device Letters*. vol. 25, No. 1, pp. 7-9 (2004).

Shiojima et al., "Improved Carrier Confinement by a Buried p-Layer in the AlGaN/GaN HEMT Structure," *IEICE Trans. Electron.*, E83-C(12), (Dec. 2000).

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Sarnoff Symposium*, Pittsburgh, PA, Mar. 18, 1998.

Sullivan et al. "High-Power 10-GHz Operation of AlGaN HFET's on Insulating SiC," *IEEE Electron Device Letters*. vol. 19, No. 6, pp. 198-200 (Jun. 1998).

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Improved Dielectric Passivation for Semiconductor Devices," U.S. Appl. No. 10/851,507, filed May 22, 2004.

United States Patent Application entitled "Nitride-Based Transistors and Methods of Fabrication Thereof Using Non-Etched Contact Recesses," U.S. Appl No. 10/617,843, filed Jul. 11, 2003.

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Co-Doping for Fermi Level Control in Semi-Insulating Group III Nitrides," U.S. Appl. No. 10/752,970, filed Jan. 7, 2004.

United States Patent Application entitled "Method of Having Laterally Grown Active Region and Methods of Facricating Same," U.S. Appl. No. 10/899,215, filed Jul. 26, 2004.

United States Patent Application entitled "Silicon Carbide on Diamond Substrates and Related Devices and Methods," U.S. Appl. No. 10/707,898, filed Jan. 22, 2004.

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "Semiconductor Devices Having A Hybrid Channel Layer Current Aperture Transistors and Methods of Fabricating Same" U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Composite Substrates of Conductive and Insulating or Semi-Insulating Group III-Nitrides for Group III-Nitride Devices," U.S. Appl. No. 11/103,127, filed Apr. 11, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

Wu et al., "3.5-Watt AiGaN/GaN HEMTs and Amplifiers at 35 GHz," Cree Santa Barbara Technology Center, Goleta, CA 93117.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs,"*IEDM Technical Digest*, p. 378-380 (2001).

Wu et al. "High Al-Content AlGaN/GaN MODFET's for Ultrahigh Performance," *IEEE Electron Device Letters*. vol. 19, No. 2, pp. 50-53 (Feb. 1998).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117.

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

CAP LAYERS INCLUDING ALUMINUM NITRIDE FOR NITRIDE-BASED TRANSISTORS

CLAIM OF PRIORITY

This application is a continuation in part of and claims priority from U.S. patent application Ser. No. 10/996,249, filed Nov. 23, 2004, now U.S. Pat. No. 7,456,443 the content of which is hereby incorporated herein by reference as if set forth in its entirety.

FIELD OF THE INVENTION

The present invention relates to semiconductor devices and, more particularly, to transistors that incorporate nitride-based active layers.

BACKGROUND

Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride-buffer layer on the substrate, an insulating gallium nitride layer on the buffer layer, an aluminum gallium nitride barrier layer on the gallium nitride layer, and a passivation layer on the aluminum gallium nitride active structure.

SUMMARY OF THE INVENTION

Some embodiments of the present invention provide Group III-nitride high electron mobility transistors and methods of fabricating Group III-nitride high electron mobility transistors that include a Group III-nitride based channel layer, a Group III-nitride based barrier layer on the channel layer and a non-uniform composition AlGaN based cap layer on the barrier layer. The non-uniform composition AlGaN based cap layer has a higher concentration of Al adjacent a surface of the cap layer that is remote from the barrier layer than is present in a region within the AlGaN based cap layer. In particular embodiments of the present invention having a gate recessed through the cap layer, the higher concentration of Al extends into the cap layer from about 30 Å to about 1000 Å. In particular embodiments of the present invention having a gate on the cap layer, the higher concentration of Al extends into the cap layer from about 2.5 Å to about 100 Å.

In further embodiments of the present invention, the AlGaN based cap layer includes a first region of $Al_xGa_{1-x}N$ at the surface of the cap layer, where x≦1 and a second region of $Al_yGa_{1-y}N$ within the AlGaN based cap layer, where y<1 and y<x. The value of x may be from about 0.2 to about 1 and y is from about 0.15 to about 0.3. In particular embodiments of the present invention, the difference between x and y and/or the thickness of the cap layer may be selected to prevent formation of a second 2DEG in the cap layer. In other embodiments of the present invention where the gate is recessed through the cap layer but does not touch the cap layer, the difference between x and y and/or the thickness of the cap layer may be selected to provide a second 2DEG in the cap layer.

In additional embodiments of the present invention, the AlGaN based cap layer further includes a third region of $Al_zGa_{1-z}N$ at an interface between the barrier layer and the AlGaN based cap layer, where z≦1 and z≠y. In some embodiments, z>y. In other embodiments, z>x. In still further embodiments, z≦x.

In particular embodiments of the present invention, the channel layer comprises a GaN layer, the barrier layer comprises an AlGaN layer and the cap layer comprises an AlGaN layer.

Some embodiments of the present invention provide Group III-nitride high electron mobility transistors and methods of fabricating Group III-nitride high electron mobility transistors that include a Group III-nitride based channel layer, a Group III-nitride based barrier layer on the channel layer and a GaN based cap layer on the barrier layer. The GaN based cap layer has a doped region adjacent a surface of the cap layer and is remote from the barrier layer.

In certain embodiments, the doped region is a region doped with n-type dopants. In particular embodiments of the present invention without a gate recess, the doped region extends into the cap layer from about 2.5 Å to about 50 Å. In particular embodiments of the present invention with a gate recess, the doped region extends into the cap layer from about 20 Å to about 5000 Å. The doped region may provide a dopant concentration of from about $10^{18}$ to about $10^{21}$ cm$^{-3}$. The n-type dopants may be Si, Ge or O. In particular embodiments of the present invention, the doped region may be one or more delta-doped regions at or near the surface of the cap layer and may, for example, have a dopant concentration of from about $10^{11}$ to about $10^{15}$ cm$^{-2}$. In particular embodiments of the present invention, the dopant is O that extends into the cap layer about 20 Å.

In other embodiments, the doped region is a region doped with p-type dopants. In particular embodiments of the present invention without a gate recess, the doped region extends into the cap layer from about 2.5 Å to about 50 Å. In particular embodiments of the present invention with a gate recess, the doped region extends into the cap layer from about 30 Å to about 5000 Å. The doped region may provide a dopant concentration of from about $10^{16}$ to about $10^{22}$ cm$^{-3}$. The p-type dopants may be Mg, Be, Zn, Ca or C. In particular embodiments of the present invention, the doped region may be one or more delta-doped regions at or near the surface of the cap layer and may, for example, have a dopant concentration of from about $10^{11}$ to about $10^{15}$ cm$^{-2}$.

In still further embodiments, the doped region is a region doped with deep level dopants. In particular embodiments of the present invention without a gate recess, the doped region extends into the cap layer from about 2.5 Å to about 100 Å. In particular embodiments of the present invention with a gate recess, the doped region extends into the cap layer from about 30 Å to about 5000 Å. The doped region may provide a dopant concentration of from about $10^{16}$ to about $10^{22}$ cm$^{-3}$. The deep level dopants may be Fe, C, V, Cr, Mn, Ni, Co or other rare earth elements.

In additional embodiments of the present invention, the doped region is a first doped region and the cap layer further includes a second doped region. The second doped region has a dopant concentration less than the dopant concentration of the first doped region. The second doped region may be the remainder of the cap layer not in the first doped region.

In particular embodiments, the channel layer comprises a GaN layer, the barrier layer comprises an AlGaN layer and the cap layer comprises a GaN or an AlGaN layer.

Some embodiments of the present invention, provide methods for passivating a surface of a wide bandgap semiconductor device that include forming a graphitic and/or amorphous BN layer on a least a portion of a surface of a region of wide bandgap semiconductor material of the wide-bandgap semiconductor device. Corresponding structures are also provided.

In further embodiments of the present invention, the wide bandgap semiconductor device is a Group III-nitride semiconductor device. For example, the wide bandgap semiconductor device may be a GaN based semiconductor device. Furthermore, the wide bandgap semiconductor device may be a Group III-nitride high electron mobility transistor.

In additional embodiments of the present invention, forming the graphitic and/or amorphous BN layer is carried out at a temperature less than a decomposition temperature of wide bandgap semiconductor materials in the wide bandgap semiconductor device. Forming the graphitic and/or amorphous BN layer may be carried out at a temperature less than about 1100° C., in some embodiments at a temperature of less than about 1000° C. and in particular embodiments at a temperature of less than about 900° C. Also, the BN layer may formed to be non-single crystal. The graphitic and/or amorphous BN layer may be formed to a thickness of from about 3 Å to about 1 μm.

Some embodiments of the present invention provide methods of passivating a surface of a Group III-nitride semiconductor device by forming a SiC layer on a least a portion of a surface of a region of Group III-nitride semiconductor material of the Group III-nitride semiconductor device. Corresponding structures are also provided.

In certain embodiments, the Group III-nitride semiconductor device may be a GaN based semiconductor device. In further embodiments, the Group III-nitride semiconductor device may be a Group III-nitride high electron mobility transistor.

In additional embodiments of the present invention, forming the SiC layer is carried out at a temperature less than a decomposition temperature of Group III-nitride semiconductor materials in the Group III-nitride semiconductor device. For example, forming the SiC layer is carried out at a temperature less than about 1100° C., in some embodiments at a temperature of less than about 1000° C. and in particular embodiments at a temperature of less than about 900° C. Also, the SiC layer may be formed to be non-single crystal. In particular embodiments, forming the SiC layer comprises forming a 3C SiC layer. The SiC layer may be formed to a thickness of from about 3 Å to about 1 μm.

Further embodiments of the present invention comprise methods of providing passivation structures for wide bandgap semiconductor devices, such as Group III-nitride semiconductor devices, comprising annealing a passivation layer directly on a Group III-nitride layer in an oxygen containing environment. The passivation layer may be, for example, SiN, BN, MgN and/or SiC. In still other embodiments, the passivation layer includes $SiO_2$, MgO, $Al_2O_3$, $Sc_2O_3$ and/or AlN.

The annealing may be carried out at a temperature of from about 100° C. to about 1000° C. and for a time of from about 10 seconds to about 1 hour. The oxygen containing environment may be only oxygen, oxygen in $N_2$, oxygen in another inert gas, such as argon, oxygen in dry air, CO, $CO_2$, NO, $NO_2$ and/or ozone. The annealing may be performed at a temperature and for a time insufficient to oxidize the structure underlying the passivation layer but sufficient to remove at least some hydrogen from the passivation layer. Some carbon may also be removed from the passivation layer.

Additional embodiments of the present invention provide methods of fabricating a passivation structure for a Group III-nitride semiconductor device by forming a passivation layer directly on a least a portion of a surface of a region of Group III-nitride semiconductor material of the Group III-nitride semiconductor device and annealing the passivation layer in $D_2$ and/or $D_2O$. In some embodiments, the passivation layer includes SiN and/or MgN. In other embodiments, the passivation layer includes BN and/or SiC. In still other embodiments, the passivation layer includes $SiO_2$, MgO, $Al_2O_3$, $Sc_2O_3$ and/or AlN.

The annealing may be performed at a temperature and for a time insufficient to oxidize a structure underlying the passivation layer but sufficient to remove at least some hydrogen from the passivation layer or exchange some hydrogen with deuterium. Furthermore, the Group III-nitride semiconductor material may be a GaN based material.

Additional embodiments of the present invention provide Group III-nitride high electron mobility transistors and method of fabricating Group III-nitride high electron mobility transistors that include a Group III-nitride based channel layer, a Group III-nitride based barrier layer on the channel layer and an AlN cap layer on the barrier layer. The transistor may further include a gate contact recessed into the AlN cap layer. In such embodiments, the AlN cap layer has a thickness of from about 5 to about 5000 Å. In some embodiments of the present invention, the AlN layer may not be coherent with the underlying layer, may be non-single crystalline, may be formed ex-situ and/or may be formed by a lower quality formation process, such as by PVD rather than CVD. The transistor may also include a gate contact on the AlN cap layer and not recessed into the AlN cap layer. In such embodiments, the AlN cap layer has a thickness of from about 2 Å to about 20 Å. Additionally, the channel layer may be a GaN layer and the barrier layer may be an AlGaN layer.

Still further embodiments of the present invention provide Group III-nitride high electron mobility transistors and methods of fabricating Group III-nitride high electron mobility transistors that include a Group III-nitride based channel layer, a Group III-nitride based barrier layer on the channel layer, a protective layer on the barrier layer, a gate contact on the barrier layer and ohmic contacts on the protective layer. In some embodiments of the present invention, the protective layer includes SiN. In other embodiments, the protective layer includes BN or MgN. In further embodiments, the protective layer comprises multiple layers, such as a layer of SiN and a layer of AlN. In particular embodiments of the present invention, the protective layer has a thickness of from about 1 Å to about 10 Å. In certain embodiments, the protective layer has a thickness of about one monolayer.

In still further embodiments of the present invention, the gate contact is on the protective layer. Also, the ohmic contacts may be directly on the protective layer. The protective layer may be formed in-situ with forming the barrier layer.

Some embodiments of the present invention provide Group III-nitride HEMTs including a Group III-nitride based channel layer and a Group III-nitride based barrier layer on the channel layer. A multilayer cap layer is provided on the barrier layer. The multilayer cap layer includes a layer including aluminum nitride (AlN) on the barrier layer and a gallium nitride (GaN) layer on the layer including AlN. A SiN passivation layer is provided on the GaN layer.

In further embodiments of the present invention, the layer including AlN may include aluminum gallium nitride (AlGaN), aluminum indium nitride (AlInN) and/or AlN. The layer including AlN may have a thickness of from about 3 to about 30 Å.

In still further embodiments of the present invention, the GaN layer may include an aluminum gallium nitride (AlGaN) layer having a low mole-fraction. The mole-fraction of the AlGaN layer may be from about zero percent of a mole-fraction of the barrier layer to about the mole-fraction of the barrier layer. The mole-fraction of the AlGaN layer may be greater than the mole-fraction of the barrier layer.

In some embodiments of the present invention, the layer including AlN may include an AlGaN layer having a high mole-fraction.

Further embodiments of the present invention provide Group III-nitride HEMTs including a Group III-nitride based channel layer and a Group III-nitride based barrier layer on the channel layer. A multilayer cap layer is provided on the barrier layer. The multilayer cap layer includes an AlGaN layer on the barrier layer and an AlN layer on the AlGaN layer.

In still further embodiments of the present invention, the AlN layer may have a thickness of about 10 Å. The HEMT may further include a gate contact that is not recessed into the multilayer cap layer. A thickness of the AlGaN layer may be from about 5.0 to about 50.0 Å.

Some embodiments of the present invention provide Group III-nitride HEMTs including a Group III-nitride based channel layer and a Group III-nitride based barrier layer on the channel layer. A multilayer cap layer is provided on the barrier layer. The multilayer cap layer includes an AlGaN layer on the barrier layer, an AlN layer on the AlGaN layer and a GaN layer on the AlN layer.

In further embodiments of the present invention, the AlN layer may have a thickness of about 10.0 Å and the GaN layer may have a thickness of about 20 Å. In certain embodiments of the present invention, the HEMT has a barrier of greater than about 3.0 V.

Various combinations and/or sub-combinations of cap layers, passivation layers, protective layers and/or anneals of passivation layers may also be provided according to some embodiments of the present invention.

DETAILED DESCRIPTION OF EMBODIMENTS OF THE INVENTION

Figure 1A:
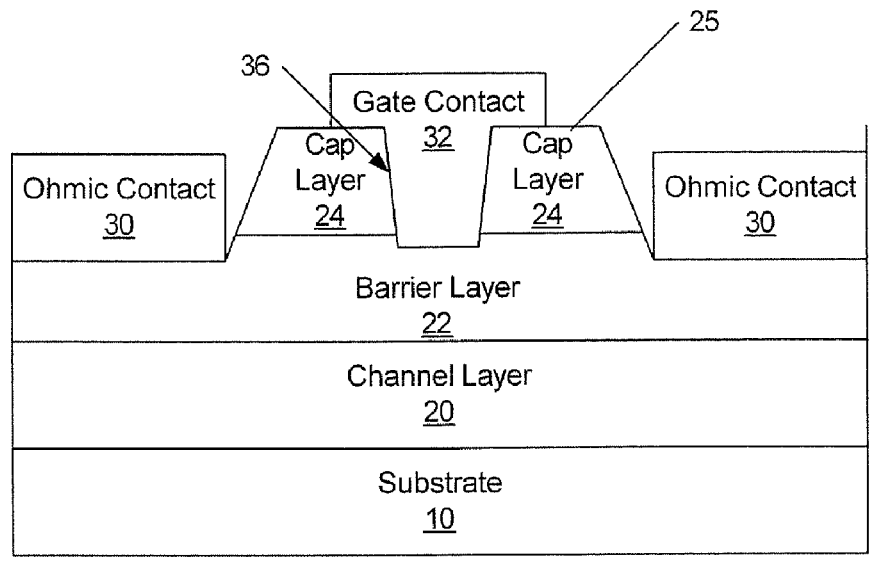
FIGS. 1A and 1B are cross-sectional schematic drawings illustrating transistors having a cap layer according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the present invention may be particularly well suited for use in nitride-based devices such as Group III-nitride based HEMTs. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Suitable structures and techniques for fabricating GaN-based HEMTs that may utilize embodiments of the present invention are described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U. S. Patent Publication No. 2002/0167023A1 to Smorchkova et al., published Nov. 14, 2002, entitled "GROUP-III NITRIDE BASED HIGH ELECTRON MOBILITY TRANSISTOR (HEMT) WITH BARRIER/SPACER LAYER", U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," U.S. patent application Ser. No. 10/772,882 filed Feb. 5, 2004 for "NITRIDE HETEROJUNCTION TRANSISTORS HAVING CHARGE-TRANSFER INDUCED ENERGY BARRIERS AND METHODS OF FABRICATING THE SAME," U.S. patent application Ser. No. 10/897,726, filed Jul. 23, 2004 entitled "METHODS OF FABRICATING NITRIDE-BASED TRANSISTORS WITH A CAP LAYER AND A RECESSED GATE," U.S. patent application Ser. No. 10/849,617, filed May 20, 2004 entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS," U.S. patent application Ser. No. 10/849,589, filed May 20, 2004 and entitled "SEMICONDUCTOR DEVICES HAVING A HYBRID CHANNEL LAYER, CURRENT APERTURE TRANSISTORS AND METHODS OF FABRICATING SAME" and U.S.

Patent Publication No. 2003/0020092 filed Jul. 23, 2002 and published Jan. 30, 2003 for "INSULATING GATE ALGAN/GAN HEMT", the disclosures of which are hereby incorporated herein by reference in their entirety.

Some embodiments of the present invention provide nitride-based HEMTs with an AlGaN cap layer that has a higher concentration of AlGaN such as at a surface that is remote from the barrier layer than at other regions of the AlGaN cap layer. Thus, the device may have a layer with a high concentration of Al as an outer surface of the device. Such a layer may improve robustness of the device during processing and/or device operation over a conventional device that includes a uniform Al concentration or a reduced Al concentration at its outer surface. For example, the increased Al concentration at the surface may not be susceptible to etching or other chemical reactions at high temperatures due to the stronger Al—N bonds compared to Ga—N bonds.

In particular embodiments of the present invention, nitride-based HEMTs with an AlN cap layer on the barrier layer is provided. Thus, the device may have a layer with a high concentration of Al as an outer surface of the device that, as discussed above, may improve robustness of the device during processing and/or device operation over a conventional device.

In further embodiments of the present invention, the outer surface of the cap layer of a nitride-based HEMT is doped with p-type, n-type or deep-level dopants such that the cap layer has a higher concentration of dopants at a surface of the cap layer that is remote from the barrier layer than at other regions of the cap layer. The cap layer may be a GaN based cap layer. The dopants at the outer surface of the device may segregate to dislocations in the cap layer and, thereby, reduce gate leakage along the dislocations. The dopant may have different characteristics when at a dislocation than when in the bulk crystal. For example, a shallow dopant in the bulk crystal may have characteristics of a deep level when at a dislocation. Thus, references to p-type, n-type of deep-level dopants refers to the characteristics of the dopants in the bulk crystal rather than at a dislocation. This may be especially true in the case of p-type or deep level dopants.

Further embodiments of the present invention provide a graphitic and/or amorphous BN passivation layer for wide bandgap semiconductor devices. As used herein, wide bandgap semiconductor devices refers to devices that include a semiconductor material having a bandgap of greater than about 2.5 eV. Graphitic and/or amorphous BN may be particularly well suited for use in GaN based devices because B is isovalent with Al, Ga and In and N is present in both materials. Thus, neither B nor N are dopants in GaN based structures. In contrast, Si is a dopant in GaN. Thus, the formation of a graphitic and/or amorphous BN passivation layer may reduce the likelihood of unintended doping of a GaN layer from Si migration. Furthermore, the graphitic and/or amorphous BN passivation layer may have reduced trap levels, different trap energies, different etch selectivity and/or improved annealing behavior as compared to conventional passivation materials, such as SiN or $SiO_x$.

Further embodiments of the present invention provide a SiC passivation layer for Group III-nitride devices. The SiC passivation layer may have reduced trap levels, different trap energies, different etch selectivity and/or improved annealing behavior as compared to conventional passivation materials, such as SiN or $SiO_x$. References to SiN, SiON, $SiO_x$, MgN and the like refer to stoichiometric and/or non-stoichiometric materials.

Exemplary devices according to some embodiments of the present invention are schematically illustrated in FIGS. 1A through 12. Thus, while embodiments of the present invention are described herein with reference to a recessed gate structure or a non-recessed gate structure, other embodiments of the present invention may include or not include a gate recess. Accordingly, embodiments of the present invention should not be construed as limited to the particular exemplary embodiments described herein but may include any suitable structure having a cap layer and/or passivation layer as described herein.

Figure 1B:
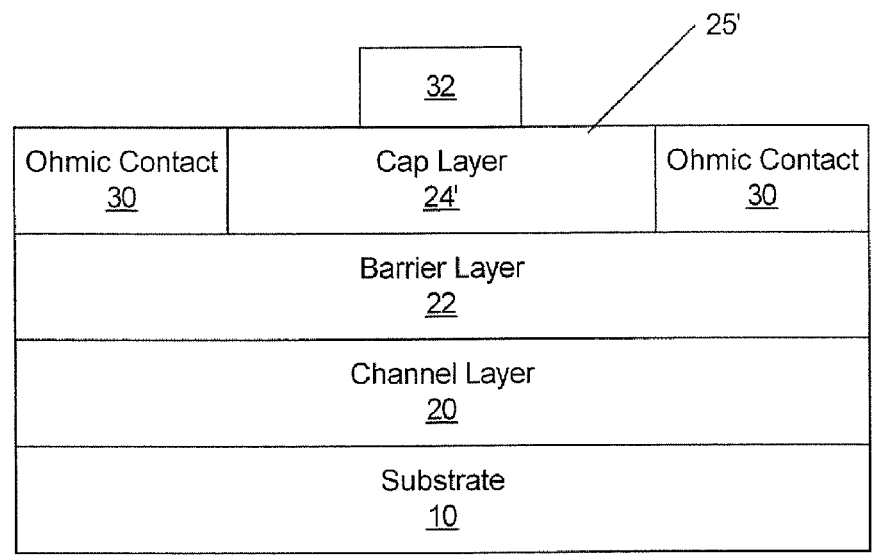

Turning to FIGS. 1A and 1B, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned U.S. Patent Publication No. 2003/0102482A1, filed Jul. 19, 2002 and published Jun. 5, 2003, and entitled "STRAIN BALANCED NITRIDE HETEROJUNCTION TRANSISTORS AND METHODS OF FABRICATING STRAIN BALANCED NITRIDE HETEROJUNCTION TRANSISTORS," or United States Patent Publication No. 2004/0012015 A1, filed Jul. 19, 2002 and published Jan. 22, 2004, and entitled "STRAIN COMPENSATED SEMICONDUCTOR STRUCTURES AND METHODS OF FABRICATING STRAIN COMPENSATED SEMICONDUCTOR STRUCTURES," the disclosures of which are incorporated herein by reference as if set forth fully herein.

Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Returning to FIGS. 1A and 1B, a channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer and/or buffer nucleation and/or transition layers may be deposited by MOCVD or by other techniques known to those of skill in the art, such as MBE or HVPE.

In some embodiments of the present invention, the channel layer 20 is a Group III-nitride, such as $Al_xGa_{1-x}N$ where $0 \leq x < 1$, provided that the energy of the conduction band edge of the channel layer 20 is less than the energy of the conduction band edge of the barrier layer 22 at the interface between the channel and barrier layers. In certain embodiments of the present invention, x=0, indicating that the channel layer 20 is GaN. The channel layer 20 may also be other Group III-nitrides such as InGaN, AlInGaN or the like. The channel layer 20 may be undoped ("unintentionally doped") and may be grown to a thickness of greater than about 20 Å. The channel layer 20 may also be a multi-layer structure, such as a superlattice or combinations of GaN, AlGaN or the like.

A barrier layer 22 is provided on the channel layer 20. The channel layer 20 may have a bandgap that is less than the bandgap of the barrier layer 22 and the channel layer 20 may also have a larger electron affinity than the barrier layer 22. The barrier layer 22 may be deposited on the channel layer 20. In certain embodiments of the present invention, the barrier layer 22 is AlN, AlInN, AlGaN or AlInGaN with a thickness of between about 0.1 nm and about 40 nm. Examples of layers according to certain embodiments of the present invention are described in U.S. Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. In particular embodiments of the present invention, the barrier layer 22 is thick enough and has a high enough Al composition and doping to induce a significant carrier concentration at the interface between the channel layer 20 and the barrier layer 22 through polarization effects. Also, the barrier layer 22 should be thick enough to reduce or minimize scattering of electrons in the channel due to ionized impurities or imperfections deposited at the interface between the barrier layer 22 and the cap layer 24.

The barrier layer 22 may be a Group III-nitride and has a bandgap larger than that of the channel layer 20 and a smaller electron affinity than the channel layer 20. Accordingly, in certain embodiments of the present invention, the barrier layer 22 is AlGaN, AlInGaN and/or AlN or combinations of layers thereof. The barrier layer 22 may, for example, be from about 0.1 nm to about 40 nm thick, but is not so thick as to cause cracking or substantial defect formation therein. In certain embodiments of the present invention, the barrier layer 22 is undoped or doped with an n-type dopant to a concentration less than about $10^{19}$ cm$^{-3}$. In some embodiments of the present invention, the barrier layer 22 is $Al_xGa_{1-x}N$ where $0 < x \leq 1$. In particular embodiments, the aluminum concentration is about 25%. However, in other embodiments of the present invention, the barrier layer 22 comprises AlGaN with an aluminum concentration of between about 5% and about 100%. In specific embodiments of the present invention, the aluminum concentration is greater than about 10%.

FIG. 1A also illustrates a cap layer 24 on the barrier layer 22 with a gate 32 in a recess 36 through the cap layer 24. FIG. 1B also illustrates a cap layer 24' on the barrier layer 22 with a gate 32 on the cap layer 24'. In some embodiments of the present invention, the cap layer 24, 24' is a non-uniform composition AlGaN layer. The cap layer 24, 24' moves the top (outer) surface of the device physically away from the channel, which may reduce the effect of the surface. The cap layer 24, 24' may be blanket formed on the barrier layer 22 and may be epitaxially grown and/or formed by deposition. Typically, the cap layer 24, 24' may have a thickness of from about 2 nm to about 500 nm.

In some embodiments of the present invention, the cap layer 24, 24' may be a graded AlGaN layer. The cap layer 24, 24' has an outer surface 25 that is remote from the barrier layer 22 where the amount of Al in the cap layer 24, 24' adjacent the surface is greater than an amount of Al in the cap layer 24, 24' in an internal region of the cap layer 24, 24'. For example, the cap layer 24, 24' may have a first amount of Al at the surface 25 and a second amount of aluminum in an internal region of the cap layer 24, 24' where the first amount is greater than the second amount. The cap layer 24, 24' may also have a third amount of Al at the interface between the cap layer 24, 24' and the barrier layer 22. The third amount may be greater than, less than or equal to the first amount. In particular embodiments of the present invention, the AlGaN cap layer 24, 24' includes a first region of $Al_xGa_{1-x}N$ at the surface 25, where $x \leq 1$ and a second region of $Al_yGa_{1-y}N$ in an internal region of the cap layer 24, 24', where y<x. In some embodiments, x is from about 0.3 to about 1. In further embodiments, y is from about 0 to about 0.9. In particular embodiments, the AlGaN cap layer includes a third region of $Al_zGa_{1-z}N$ at the interface between the barrier layer 22 and the cap layer 24, 24', where $z \leq 1$ and $z \neq y$. Furthermore, z may be greater than y. For example, in some embodiments of the present invention an AlN layer may be provided as the barrier layer or a part of the cap layer adjacent the barrier layer. In such a case, the cap layer 24, 24' may include a graded Al concentration from z to y and from y to x. In particular embodiments of the present invention having a gate recessed through the cap layer 24, the higher concentration of Al extends into the cap layer from about 30 Å to about 1000 Å. In particular embodiments of the present invention having a gate on the cap layer 24', the higher concentration of Al extends into the cap layer from about 2.5 Å to about 100 Å.

The cap layer 24, 24' may be provided by conventional epitaxial growth techniques where a higher Al concentration is provided during termination of growth of the cap layer 24, 24'. Thus, for example, the cap layer 24, 24' may be provided by MOCVD growth with an increase in the Al source just prior to and during termination of growth.

As is further illustrated in FIGS. 1A and 1B, ohmic contacts 30 are provided on the barrier layer 22. A patterned mask and etch process may be used to expose the underlying barrier layer 22. In some embodiments of the present invention, the etch may be a low damage etch. In some embodiments of the present invention the etch is a wet etch with a strong base, such as KOH with UV illumination. In other embodiments, the etch is a dry etch. Examples of low damage etch techniques for Group III-nitrides include etching techniques other than reactive ion etching, such as inductively coupled plasma using $Cl_2$, $BCl_3$, $CCl_2F_2$ and/or other chlorinated species or electron cyclotron resonance (ECR) and/or downstream plasma etching with no DC component to the plasma. As is further illustrated in FIGS. 1A and 1B, ohmic metal is patterned to provide ohmic contact material patterns that when annealed provide the ohmic contacts 30. While illustrated as recessed in FIGS. 1A and 1B, in some embodiments of the present invention, the ohmic contacts 30 need not be recessed.

As illustrated in FIG. 1A, a gate recess may also be provided through the cap layer 24 to expose a portion of the barrier layer 22. In some embodiments of the present invention, the recess 36 is formed to extend into the barrier layer 22. The recess 36 may extend into the barrier layer 22 to, for example adjust performance characteristics of the device such as threshold voltage, frequency performance, etc. The recess may be formed using a mask and an etch process as described above. In particular embodiments where the ohmic contacts 30 provide source and drain contacts, the recess may be offset between the source and drain contacts such that the recess, and subsequently the gate contact 32, is closer to the source contact than the drain contact.

A gate contact 32 is formed in the recess and contacts the exposed portion of the barrier layer 22. The gate contact may be a "T" gate as illustrated in FIG. 1A and may be fabricated using conventional fabrication techniques. The gate contact 32 may also be formed on the cap layer 24' as illustrated in FIG. 1B and may be fabricated using conventional fabrication techniques. Suitable gate materials may depend on the composition of the barrier layer, however, in certain embodiments, conventional materials capable of making a Schottky contact to a nitride based semiconductor material may be used, such as Ni, Pt, $NiSi_x$, Cu, Pd, Cr, W and/or WSiN.

A conventional passivation layer or a BN passivation layer as described below may also be provided on the structures of FIGS. 1A and 1B. For example, a SiN layer and, in some embodiments, an extremely thin SiN layer, may be formed in situ. A MgN passivation layer, such as that described in U.S. Pat. No. 6,498,111 entitled "FABRICATION OF SEMICONDUCTOR MATERIALS AND DEVICES WITH CONTROLLED ELECTRICAL CONDUCTIVITY," the disclosure of which is incorporated herein by reference as if set forth in its entirety, could also be utilized. Optionally, an anneal of the structure including the passivation layer may be carried out in an oxygen environment to remove hydrogen from the layer and alter surface states and/or add oxygen to the surface. If an oxygen anneal is performed, the anneal may be performed in a manner to not significantly oxidize the layer between the passivation layer and the underlying Group III-nitride layer. For example, in some embodiments of the present invention, the annealing may be carried out at a temperature of from about 100° C. to about 1000° C. and for a time of from about 10 seconds to about 1 hour. The oxygen containing environment may be only oxygen, oxygen in $N_2$, oxygen in another inert gas, such as argon, oxygen in dry air, CO, $CO_2$, NO, $NO_2$ and/or ozone. The gases used to provide the oxygen containing environment may be free of hydrogen so as to not incorporate hydrogen into the passivation layer. Alternatively or additionally, an anneal may be carried out in $D_2$ or $D_2O$.

Transistors according to embodiments of the present invention may be fabricated utilizing techniques such as those discussed in the patent applications and patents incorporated by reference herein, including, for example, as described in U.S. patent application Ser. No. 10/849,617, filed May 20, 2004 and entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS" and U.S. patent application Ser. No. 10/897,726, filed Jul. 23, 2004 and entitled "METHODS OF FABRICATING NITRIDE-BASED TRANSISTORS WITH A CAP LAYER AND A RECESSED GATE," the disclosures of which are incorporated herein as if described in their entirety.

Figure 2A:
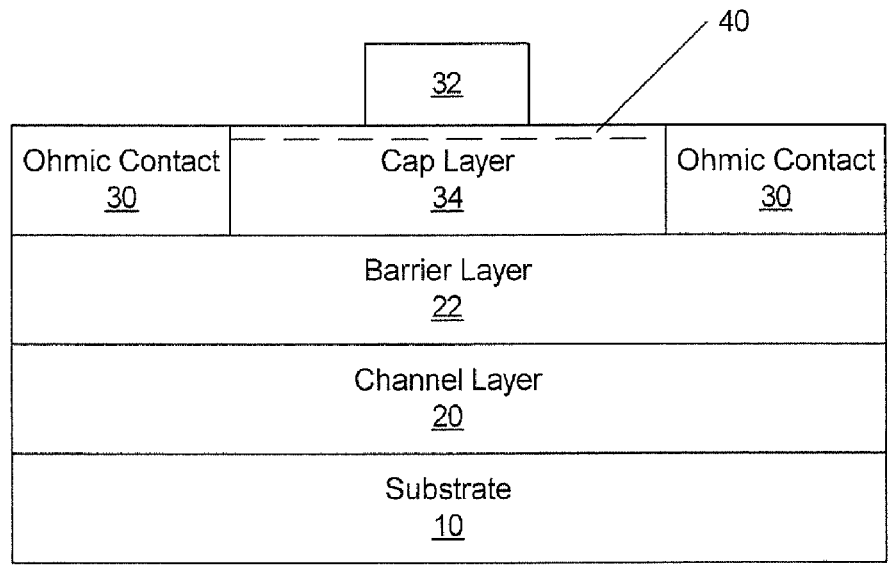
FIGS. 2A and 2B are cross-sectional schematic drawings illustrating transistors having a cap layer according to some embodiments of the present invention.
Figure 2B:
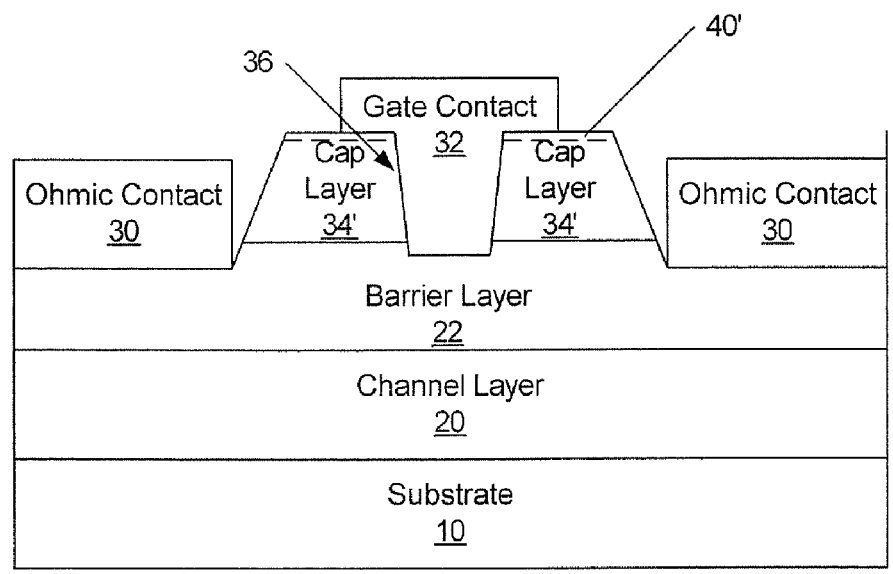

FIGS. 2A and 2B illustrate high electron mobility transistors having a cap layer 34, 34' according to further embodiments of the present invention. The substrate 10, channel layer 20, barrier layer 22, ohmic contacts 30 and gate contact 32 may be provided as discussed above with reference to FIGS. 1A and 1B. As seen in FIGS. 2A and 2B, the cap layer 34, 34' includes a doped region 40 at or near the outer surface of the cap layer 34, 34'. The cap layer 34, 34' may be a GaN based cap layer, such as a GaN layer and/or an AlGaN layer as described, for example, in the patents and patent application incorporated by reference herein. In some embodiments of the present invention, the doped region 40 is doped with p-type dopant, such as Mg, Be, Zn, Ca and/or C. In other embodiments of the present invention, the doped region 40 is doped with an n-type dopant, such as Si, Ge and/or O. In further embodiments of the present invention, the doped region 40 is doped with a deep level dopant, such as Fe, C, V, Cr, Mn, Ni and/or Co. The dopant may be incorporated into the cap layer 34 during deposition or growth of the cap layer 34, 34' or may be subsequently implanted, for example, using ion implantation. In some embodiments of the present invention, the cap layer 34 has a dopant incorporated throughout the cap layer 34, 34'. In such a case, the doped region 40 may be provided by a region of increased dopant concentration over the concentration of dopant in the remainder of the cap layer 34, 34'. Techniques for co-doping Group III-nitride materials are described, for example, in U.S. patent application Ser. No. 10/752,970, filed Jan. 7, 2004 entitled "CO-DOPING FOR FERMI LEVEL CONTROL IN SEMI-INSULATING GROUP III NITRIDES," the disclosure of which is incorporated herein as if set forth in its entirety.

In embodiments of the present invention where the dopants are n-type dopants, the n-type dopants may be Si, Ge or O. In particular embodiments of the present invention without a gate recess, the doped region 40 extends into the cap layer 34 from about 2.5 Å to about 50 Å. In particular embodiments of the present invention with a gate recess, the doped region 40 extends into the cap layer 34' from about 20 Å to about 5000 Å. With n-type dopants, the doped region 40 in embodiments without a gate recess may provide a dopant concentration of from about $10^{18}$ to about $10^{21}$ cm$^{-3}$ and may be more heavily doped than $10^{21}$ cm$^{-3}$ if a gate recess is provided. In particular embodiments of the present invention, the doped region 40 may be one or more delta-doped regions at or near the surface of the cap layer 34, 34' and may, for example, have a dopant concentration of from about $10^{11}$ to about $10^{15}$ cm$^{-2}$. As used herein, a delta-doped region is at the surface if it is within about 5 Å of the surface and near the surface if it is within about 50 Å of the surface. In particular embodiments of the present invention, the dopant is O that extends into the cap layer 34, 34' about 20 Å. N-type dopants may be used to screen the channel region from surface states and pin the surface energy level at a predictable and desired level to reduce and/or minimize trapping effects. The level of doping should be sufficiently high so as to be the dominant "surface" state in embodiments without a recessed gate but not so high as to provide excessive current leakage paths.

In other embodiments, the doped region 40 is a region doped with p-type dopants. In particular embodiments of the present invention without a gate recess, the doped region 40 extends into the cap layer 34 from about 2.5 Å to about 100 Å. In particular embodiments of the present invention with a gate recess, the doped region 40 extends into the cap layer 34' from about 30 Å to about 5000 Å. With p-type dopants, the doped region 40 may provide a dopant concentration of from about $10^{16}$ to about $10^{22}$ cm$^{-3}$. The p-type dopants may be Mg, Be, Zn, Ca and/or C. In particular embodiments of the present invention, the doped region may be one or more delta-doped regions at or near the surface of the cap layer and may, for example, have a dopant concentration of from about $10^{11}$ to about $10^{15}$ cm$^{-2}$. P-type dopants may be used to screen the channel region from surface states, pin the surface energy level at a predictable and desired level to reduce and/or minimize trapping effects and to reduce leakage currents. The level of doping should be sufficiently high so as to reduce leakage current in embodiments without a recessed gate and be the dominant "surface" state but not so high as to provide introduce traps or leakage paths by becoming a conductive layer. However, in particular embodiments of the present invention have a recessed gate as illustrated, for example, in FIG. 2B, if an insulating region, such as a SiN layer or gap, is provided between the cap layer 34' and the gate contact 32, a high level of p-type dopants may be provided such that the cap layer 34' may be provided as a conductive layer.

Furthermore, in certain embodiments of the present invention, the doped region 40 may be doped with p-type dopants so as to provide a p-n junction between the doped region and the cap layer 34 and the gate contact 32 is provided directly on the doped region 40 so as to provide a Junction HEMT (JHEMT). In such a case, the dope region 40 would not extend to the ohmic contacts 30, which may be isolated from the doped region by an insulating region, such as a SiN layer or gap.

In still further embodiments, the doped region 40 is a region doped with deep level dopants. In particular embodiments of the present invention without a gate recess, the doped region 40 extends into the cap layer 34 from about 2.5 Å to about 100 Å. In particular embodiments of the present invention with a gate recess, the doped region 40 extends into the cap layer 34' from about 30 Å to about 5000 Å. With deep level dopants, the doped region 40 may provide a dopant concentration of from about $10^{16}$ to about $10^{22}$ cm$^{-3}$. The deep level dopants may be Fe, C, V, Cr, Mn, Ni, Co or other rare earth elements. Deep level dopants may be used to screen the channel region from surface states, pin the surface energy level at a predictable and desired level to reduce and/or minimize trapping effects and to reduce leakage currents. The level of doping should be sufficiently high so as to reduce leakage current in embodiments without a recessed gate and be the dominant "surface" state but not so high as to cause significant trapping.

Figure 3A:
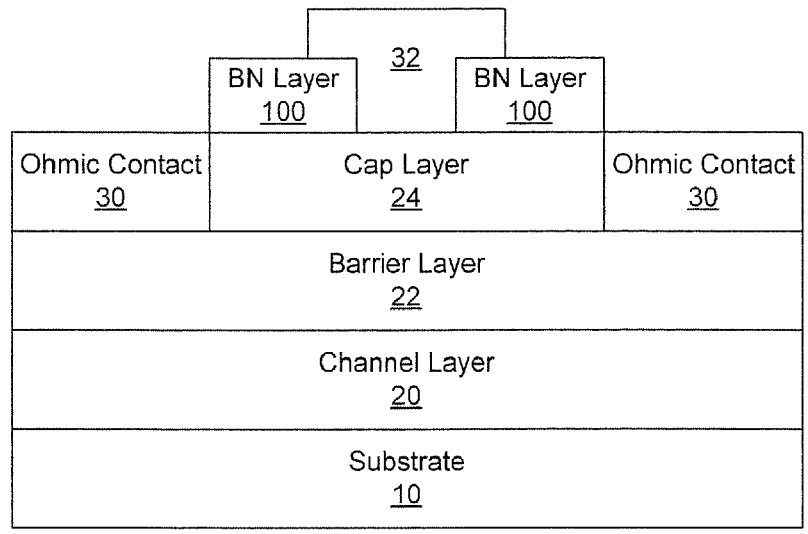
FIGS. 3A and 3B are cross-sectional schematic drawings illustrating graphitic and/or amorphous BN passivation layers according to some embodiments of the present invention.
Figure 3B:
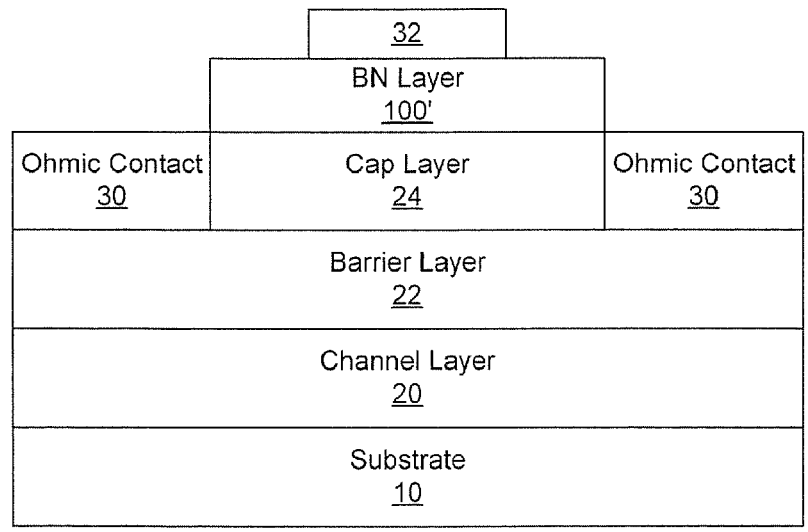

FIGS. 3A and 3B illustrate electronic devices incorporating a graphitic and/or amorphous BN passivation layer according to some embodiments of the present invention. The substrate 10, channel layer 20, barrier layer 22, cap layer 24, ohmic contacts 30 and gate contact 32 may be provided as discussed above with reference to FIGS. 1A, 1B and/or FIGS. 2A, 2B. As is further illustrated in FIGS. 3A and 3B, a graphitic and/or amorphous BN passivation layer 100, 100' is provided on exposed surfaces of the device. In particular embodiments of the present invention, the graphitic BN passivation layer 100, 100' is a non-single crystal layer. The graphitic and/or amorphous BN passivation layer 100, 100' may be provided as a single layer or may be multiple layers and may be incorporated with layers of other materials, such as SiN or SiO$_x$. In particular embodiments of the present invention the graphitic or amorphous BN passivation layer 100 where the gate is recessed through the BN passivation layer 100, the BN passivation layer 100 may have a thickness of from about 3 Å to about 1 μm. In particular embodiments of the present invention the graphitic or amorphous BN passivation layer 100' where the gate is not recessed through the BN passivation layer 100', the BN passivation layer 100' may have a thickness of from about 2 Å to about 100 Å. Thus, in the embodiments illustrated in FIG. 3B, a MISHEMT may be provided. Furthermore, as discussed above, the gate may be recessed into or through the cap layer 24 as illustrated, for example, in FIGS. 1A and 2B, and the BN passivation layer 100, 100' may extend into the recess in the cap layer 24, into the recess and onto the barrier layer 22 or may terminate at the gate contact 32. Thus, in some embodiments of the present invention a MISHEMT may be provided with a recessed gate.

Techniques for forming graphitic and/or amorphous BN, such as by MOCVD, are known to those of skill in the art and, therefore, need not be described further herein. For example, a BN layer may be formed by flowing TEB and NH$_3$ in a carrier gas. However, the formation of the graphitic and/or amorphous BN passivation layer 100 should be carried out at temperatures below the decomposition temperature of the underlying structure on which the passivation layer 100 is formed. Thus, for example, for a GaN based structure, the graphitic and/or amorphous BN passivation layer 100 should be formed at temperatures of less than about 1100° C. and in some embodiments less than about 950° C. In some embodiments, the passivation layer 100 may be subsequently annealed as described above.

Figure 4A:
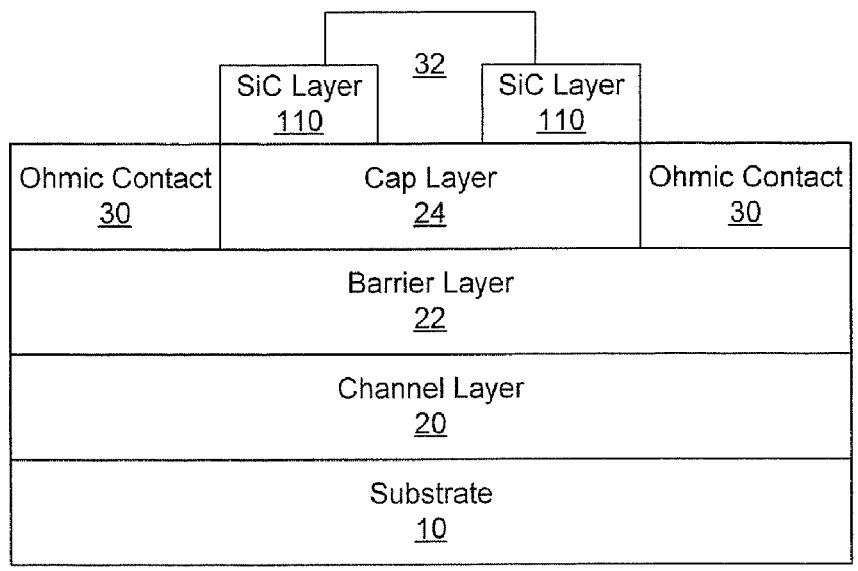
FIGS. 4A and 4B are cross-sectional schematic drawings illustrating SiC passivation layers according to some embodiments of the present invention.
Figure 4B:
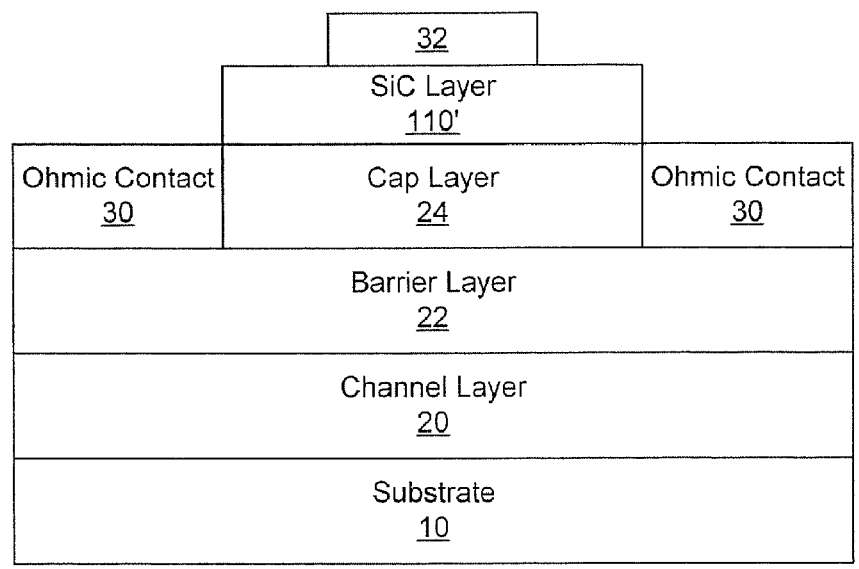

FIGS. 4A and 4B illustrate electronic devices incorporating a SiC passivation layer according to some embodiments of the present invention. The substrate 10, channel layer 20, barrier layer 22, cap layer 24, ohmic contacts 30 and gate contact 32 may be provided as discussed above with reference to FIGS. 1A, 1B and/or FIGS. 2A, 2B. As is further illustrated in FIGS. 4A and 4B, a SiC passivation layer 110, 110' is provided on exposed surfaces of the device. In particular embodiments of the present invention, the SiC passivation layer 110, 110' is a non-single crystal layer. In some embodiments of the present invention, the SiC passivation layer 110, 110' is insulating or p-type SiC. If the SiC passivation layer, 110' is p-type SiC, an insulating region, such as a SiN layer or a gap, may be provided between the SiC passivation layer 110, 110' and the ohmic contacts 32. In some embodiments of the present invention, the SiC passivation layer 110, 110' is 3C SiC as 3C SiC may be formed on on-axis (0001) hexagonal materials in a low temperature process. The SiC passivation layer 110, 110' may be provided as a single layer or may be multiple layers and may be incorporated with layers of other materials, such as SiN or SiO$_2$. In particular embodiments of the present invention the SiC passivation layer 110 where the gate is recessed through the SiC passivation layer 110, the SiC passivation layer 110 may have a thickness of from about 3 Å to about 1 μm. In particular embodiments of the present invention the SiC passivation layer 110' where the gate is not recessed through the SiC passivation layer 110', the SiC passivation layer 110' may have a thickness of from about 2 Å to about 100 Å. Thus, in the embodiments illustrated in FIG. 4B, a MISHEMT may be provided. Furthermore, as discussed above, the gate may be recessed into or through the cap layer 24 as illustrated, for example, in FIGS. 1A and 2B, and the SiC passivation layer 110, 110' may extend into the recess in the cap layer 24, into the recess and onto the barrier layer 22 or may terminate at the gate contact 32. Thus, in some embodiments of the present invention a MISHEMT may be provided with a recessed gate.

Techniques for forming SiC layers are known to those of skill in the art and, therefore, need not be described further herein. However, the formation of the SiC passivation layer 110 should be carried out at temperatures below the decomposition temperature of the underlying structure on which the passivation layer 110 is formed. Thus, for example, for a GaN based structure, the SiC passivation layer 110 should be formed at temperatures of less than about 1100° C. and in some embodiments less than about 950° C. Techniques for forming SiC at such low temperatures may include CVD or PECVD using, for example, SiH$_4$ and C$_3$H$_8$ as Si and C sources, or very low temperature sputtering. Furthermore, the SiC layer may be doped with impurities to control the properties of the SiC passivation layer 110. For example, n-type SiC may be doped with N, p-type SiC may be doped with Al and/or B and insulating SiC may be doped with V or Fe. In some embodiments, the passivation layer 100 may be subsequently annealed as described above.

While FIGS. 3A, 3B and 4A, 4B illustrate passivation layers 100, 100' and 110, 110' on a cap layer 24, other cap layers, such as the cap layer 34, conventional single or multiple cap layers or no cap layer may be provided. For example, the passivation layers 100, 100' and 110, 110' could be used with a cap layer that included an AlN layer at its outer surface such that the passivation layers were provided on the AlN layer. Thus, the use of a graphitic or amorphous BN passivation layer 100, 100' or a SiC passivation layer 110, 110' should not be construed as limited to the particular structure illustrated in FIGS. 3A, 3B and 4A, 4B but may be used on any Group III-nitride semiconductor device or other wide bandgap semiconductor device.

While embodiments of the present have been described with reference to HEMT structures where the gate is directly on the barrier or cap layers, in some embodiments of the present invention an insulating layer may be provided between the gate and the barrier or cap layer. Thus, in some embodiments of the present invention, an insulating gate HEMT may be provided, for example, as described in U.S. Patent Publication No. 2003/0020092 entitled "INSULATING GATE ALGAN/GAN HEMT", to Parikh et al., the disclosure of which is incorporated herein by reference as if set forth fully herein. In some embodiments, the insulating layer may be of graphitic and/or amorphous BN.

Figure 5A:
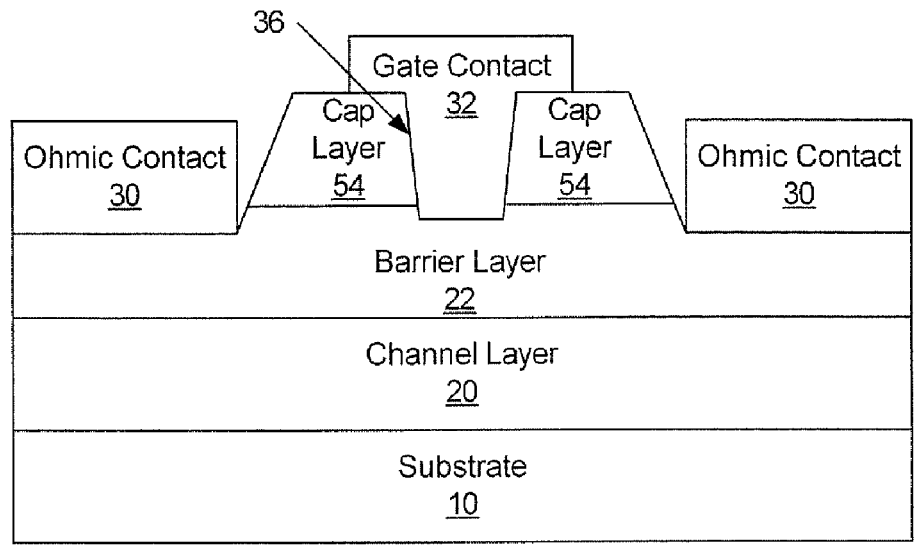
FIGS. 5A and 5B are cross-sectional schematic drawings illustrating transistors having a cap layer according to some embodiments of the present invention.
Figure 5B:
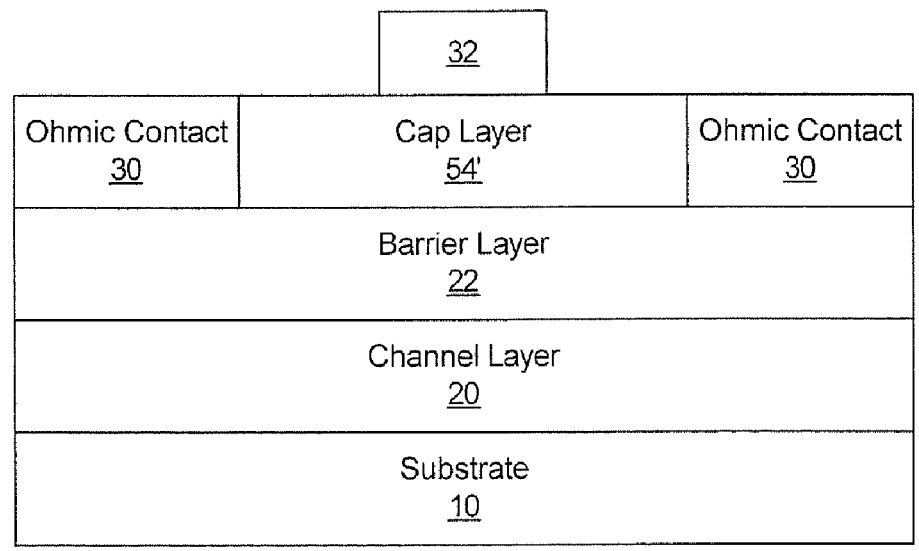

FIGS. 5A and 5B illustrate further embodiments of the present invention incorporating an AlN cap layer 54, 54'. FIG. 5A also illustrates an AlN cap layer 54 on the barrier layer 22 with a recessed gate 32 through the AlN cap layer 54. FIG. 5B also illustrates an AlN cap layer 54' on the barrier layer 22 with a gate 32 on the AlN cap layer 54'. The cap layer 54, 54' moves the top (outer) surface of the device physically away from the channel, which may reduce the effect of the surface. Furthermore, the AlN cap layer 54, 54' may provide increased chemical stability and protect the underlying layers in that the AlN cap layer 54, 54' may not be susceptible to etching or other chemical reactions at high temperatures due to the stronger Al—N bonds compared to Ga—N bonds.

The AlN cap layer 54, 54' may be blanket formed on the barrier layer 22 and may be epitaxially grown and/or formed by deposition. Typically, the cap layer 54, 54' may have a thickness of from about 0.2 nm to about 500 nm. In particular embodiments of the present invention having a gate recessed through the AlN cap layer 54, the AlN cap layer 54 has a thickness of from about 10 Å to about 5000 Å. In particular embodiments of the present invention having a gate on the AlN cap layer 54', the AlN cap layer 54' has a thickness of from about 2 Å to about 50 Å.

The AlN cap layer 54, 54' may be provided by conventional epitaxial growth techniques by termination of the Ga source during termination of growth of the barrier layer 22. Thus, for example, the AlN cap layer 54, 54' may be provided by MOCVD growth by termination of the Ga source just prior to and during termination of growth.

Figure 6:
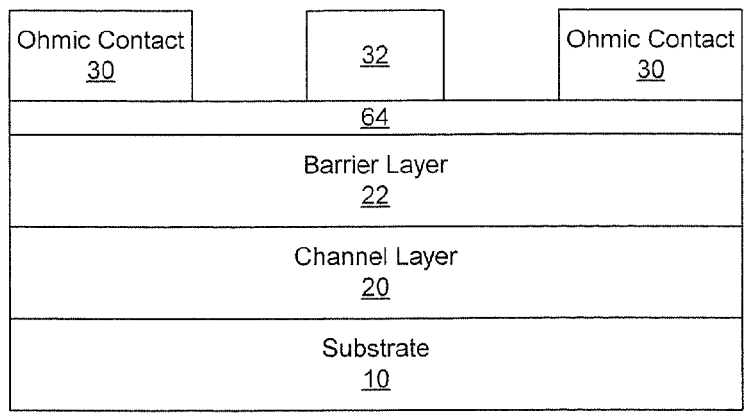
FIG. 6 is a cross-sectional schematic drawing illustrating transistors having ohmic contacts on a protective layer according to some embodiments of the present invention.

FIG. 6 illustrates further embodiments of the present invention where a protective layer 64 is provided on the barrier layer 22. As is illustrated in FIG. 6, the ohmic contacts are provided on the protective layer 64. The gate contact 32 may also be provided on the protective layer 64. In certain embodiments of the present invention, the ohmic contacts 30 are provided directly on the protective layer 64 and the gate contact 32 may also be provided directly on the protective layer 64.

The protective layer 64 may be a SiN layer deposited prior to formation of the ohmic contacts 30 and the gate contact 32. Alternatively, the protective layer 64 may be a BN or MgN layer. MgN may be especially suitable for use with p-type devices as additional doping may be provided upon anneal of the ohmic contact material. The protective layer 64 may be a single layer, such as a single SiN, MgN or BN layer, or, in some embodiments, protective layer 64 may be provided as multiple layers, such as a layer of SiN and a layer of AlN.

The protective layer 64 may have a thickness of from about 1 Å to about 10 Å and, in some embodiments, may have a thickness of about one monolayer. Because the protective layer 64 is thin, there may be no need to recess the ohmic contacts through the protective layer 64. Reliability may be improved through better surface state control and lower gate leakage current in comparison to devices without such a protective layer.

The protective layer 64 may be formed in-situ with the formation of the barrier layer. Because the protective layer 64 is very thin, there may be very little additional fabrication cost other than providing a Si source, B source or Mg source and only a small additional growth time to deposit the thin protective layer 64. Furthermore, because the protective layer 64 is thin, no additional steps may be needed to form recesses for the gate and/or ohmic contacts.

In the fabrication processes discussed above, gates may be formed by etching a 0.3 to 0.7 μm line in a layer of SiN that has a thickness of from about 50 nm to about 150 nm, forming a longer line, for example, 1.0 μm or more, overlapping the previous line by from about 0.1 to 0.6 μm on each side, in a photoresist and depositing metal into the line. The excess metal may be removed by dissolving the photoresist.

While the gate is etched it may be possible to inadvertently etch the AlGaN and/or hot electrons striking the AlGaN/SiN interface, especially on the drain side of the gate, may create trap states at the interface or in the SiN, which may cause the device to be unreliable.

Thus, according to some embodiments of the present invention a thin AlN layer may be provided on an AlGaN cap layer, which may increase the selectivity of the etch, reducing the amount of AlGaN that is etched. As used herein, a "thin AlN layer" refers to an AlN layer having a thickness of from about a few monolayers to about 50 Å. Furthermore, AlN has a higher bandgap and stronger bonding properties relative to AlGaN, so the amount of electron injection into the SiN interface or the SiN itself may be reduced. It will be understood that according to some embodiments of the present invention the design of the epitaxial layer should be done to take polarization fields into account in order to accomplish the reduction of electron injection.

According to some embodiments of the present invention including a thin AlN or high mole-fraction AlGaN layer, the etch stopping qualities of the AlN may be combined with the highest possible potential barrier as discussed further below.

Figure 7:
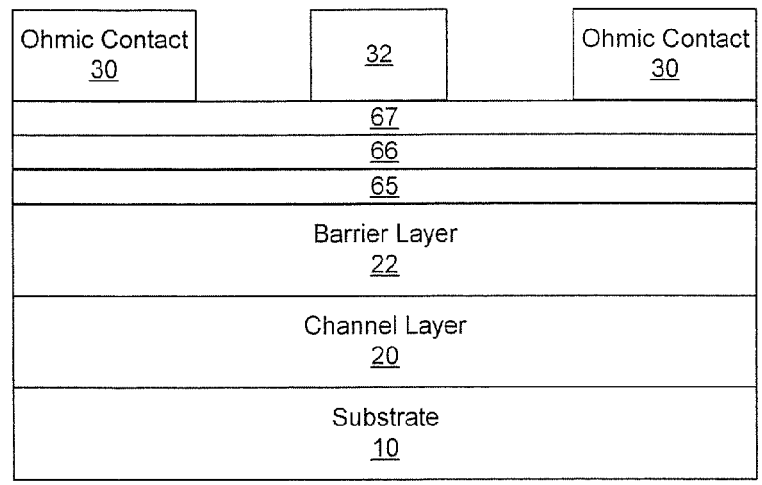
FIG. 7 is a cross-sectional schematic drawing illustrating transistors including a protective layer and a cap layer according to some embodiments of the present invention.

Referring now to FIG. 7, further embodiments of the present invention include a multilayer cap layer (65, 66) and a protective layer 67 on the barrier layer 22. As is illustrated in FIG. 7, the multilayer cap layer includes a layer including AlN 65 and a layer of GaN 66. The layer including AlN 65 may include AlGaN, AlInd and/or AlN. The layer including AlN 65 may have a thickness of from about 3.0 to about 30.0 Å. In some embodiments of the present invention, the layer including AlN 65 may be an AlGaN layer having a high mole-fraction. As used herein, "mole fraction" refers to the AlN mole-fraction in an AlN—GaN alloy. As used herein, "a high mole-fraction" refers to a mole fraction of from about 30 to about 100%.

In some embodiments of the present invention, the GaN layer 66 may be replaced by, for example, an AlGaN layer having a low mole-fraction. As used herein, "a low mole-fraction" refers to a mole fraction of from about 0 to about 30%. The mole-fraction of the AlGaN layer may be from about zero percent of a mole-fraction of the barrier layer to about the mole-fraction of the barrier layer. The mole-fraction of the AlGaN layer may be greater than the mole-fraction of the barrier layer.

It will be understood that although the gate 32 illustrated in embodiments of the present invention illustrated in FIG. 7 is not recessed into the multilayer cap layer, embodiments of the present invention are not limited to the configuration illustrated therein. For example, the gate 32 may be recessed without departing from the scope of the present invention.

Figure 8:
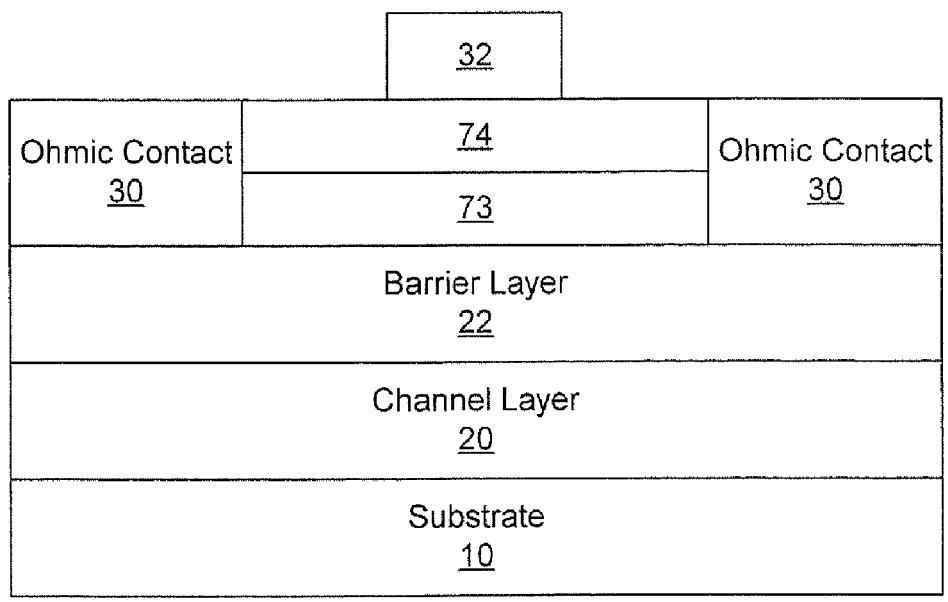
FIG. 8 is a cross-sectional schematic drawing illustrating transistors having a multi-layer cap layer according to some embodiments of the present invention.

Referring now to FIG. 8, further embodiments of the present invention include a multilayer cap layer (73, 74) on the barrier layer 22. As is illustrated in FIG. 8, the multilayer cap layer includes an AlGaN 73 layer on the barrier layer 22 and a layer of AlN 74 on the AlGaN layer 73. In embodiments of the present invention illustrated in FIG. 8, the AlN layer 74 may have a thickness of about 10 Å. As discussed above, the AlN layer 74 may include an AlGaN layer having a high mole-fraction.

As further illustrated in FIG. 8, the gate contact 32 is not recessed into the multilayer cap layer. In these embodiments of the present invention, a thickness of the AlGaN layer 73 may be from about 5.0 to about 50.0 Å. It will be understood that embodiments of the present invention are not limited to the configuration illustrated in FIG. 8. For example, if the gate contact 32 were recessed the thickened of the AlGaN layer 73 may be much larger, such as about 250 Å. Simulated conduction band edge and electron density as a function of depth for devices according to embodiments of the present invention illustrated in FIG. 8 will be discussed below with respect to FIG. 11.

Figure 9:
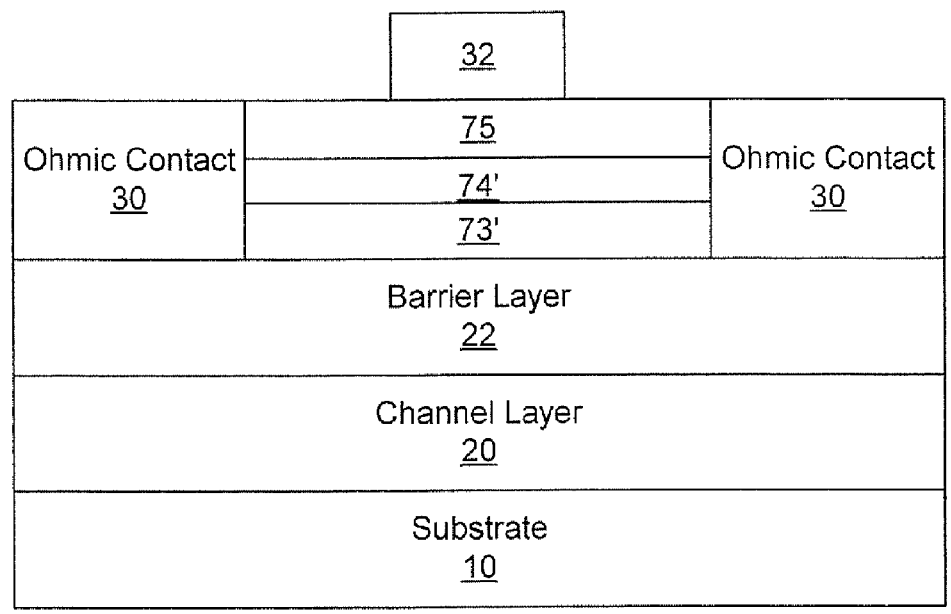
FIG. 9 is a cross-sectional schematic drawing illustrating transistors having a multi-layer cap layer according to some embodiments of the present invention.

Referring now to FIG. 9, further embodiments of the present invention include a multilayer cap layer (73', 74', 75) on the barrier layer 22. As is illustrated in FIG. 9, the multilayer cap layer includes a layer including AlGaN 73' on the barrier layer 22, a layer of AlN 74' on the AlGaN layer 73' and a layer of GaN 75 on the AlN layer 74'. In embodiments of the present invention illustrated in FIG. 9, the AlN layer 74' has a thickness of about 10.0 Å and the GaN layer has a thickness of about 20 Å. Embodiments of HEMTs illustrated in FIG. 9 may have a barrier of greater than about 3.0 V.

As illustrated in FIG. 9, the gate contact 32 is not recessed into the multilayer cap layer. Although, it will be understood that embodiments of the present invention are not limited to the configuration illustrated in FIG. 9. Simulated conduction band edge and electron density as a function of depth for devices according to embodiments of the present invention illustrated in FIG. 9 will be discussed below with respect to FIG. 12.

Figure 10:
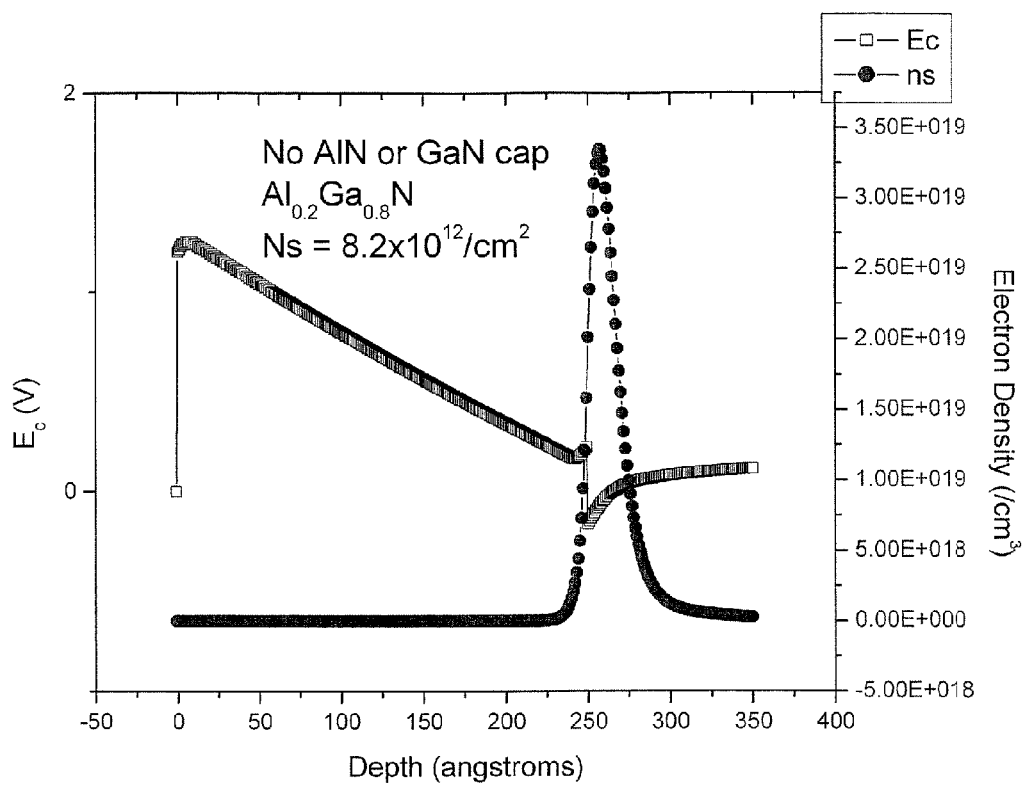
FIG. 10 is a graph illustrating simulated conduction band edge and electron density as a function of depth for devices having an AlGaN cap according to some embodiments of the present invention.
Figure 11:
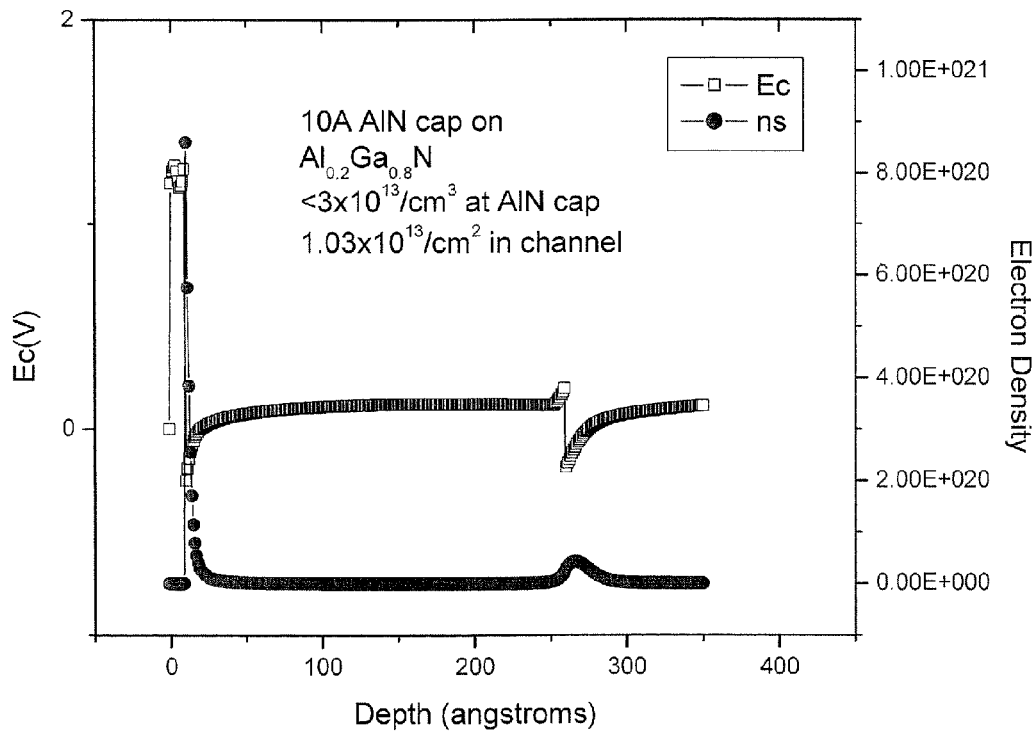
FIG. 11 is a graph illustrating simulated conduction band edge and electron density as a function of depth for devices having an AlN cap on AlGaN according to some embodiments of the present invention.
Figure 12:
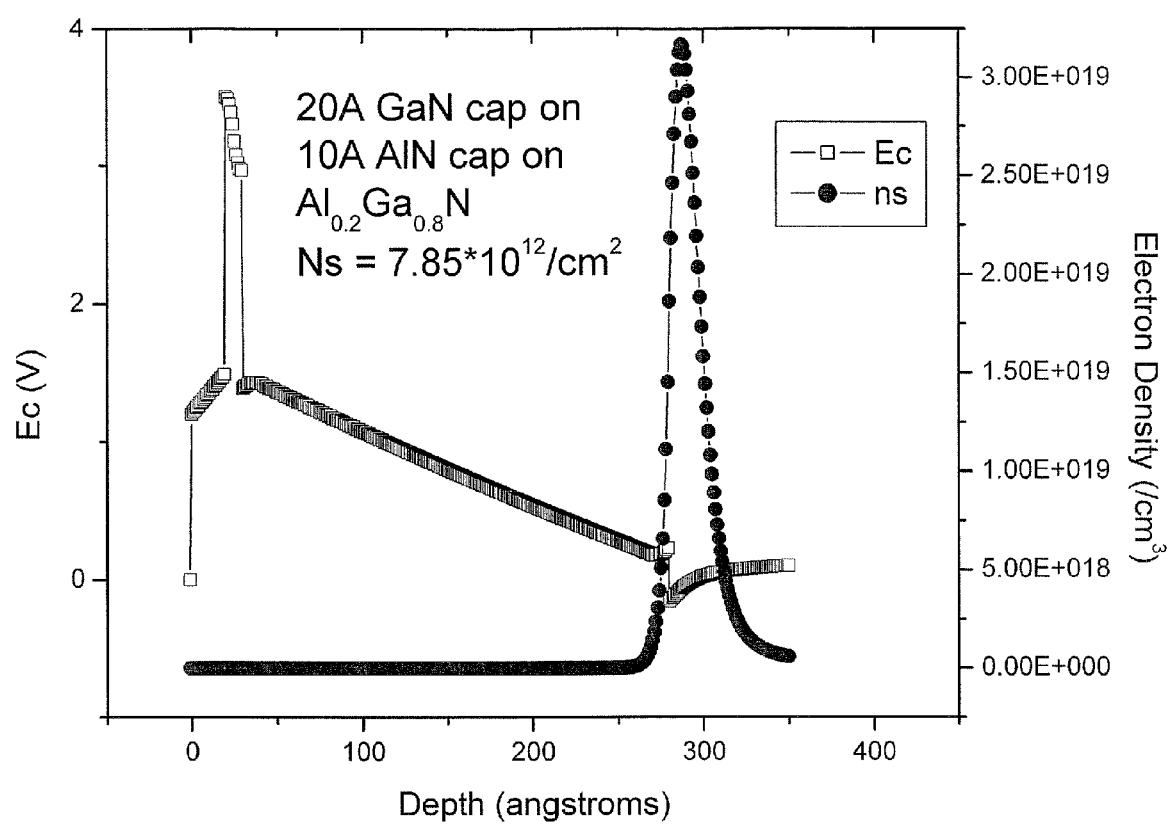
FIG. 12 is a graph illustrating simulated conduction band edge and electron density as a function of depth for devices having a GaN/AlN cap on AlGaN according to some embodiments of the present invention.

Referring now to the graphs illustrated in FIGS. 10 through 12. In particular, FIG. 10 illustrates simulated conduction band edge and electron density as a function of depth for devices including an AlGaN cap and no AlN or GaN cap. FIG. 11 illustrates simulated conduction band edge and electron density as a function of depth for devices according to embodiments of the present invention illustrated in FIG. 8. As illustrated in FIG. 11, the addition of the AlN layer 74, a wider bandgap material, may induce an excessive polarization charge, thus lowering the effective barrier of the device. FIG. 12 illustrates simulated conduction band edge and electron density as a function of depth for devices according to embodiments of the present invention illustrated in FIG. 9. As illustrated in FIG. 12, a multilayer cap including AlN with a GaN cap on the AlN may result in a relatively higher barrier (over 3.0 V vs. 1.25 for the standard structure) with a roughly similar amount of charge in the channel as illustrated in FIG. 10. It will be understood that in some embodiments of the present invention, the thicknesses of the GaN layer 75 and the AlN layer 74' may be changed to tune the resulting charge density.

Referring to the graphs of FIGS. 10 through 12 illustrating simulated conduction band edge and electron density as a function of depth according to some embodiments of the present invention, a constant Ec for the top interface was used. In some embodiments of the present invention, the conduction band edge of the AlGaN at the top of a standard structure may be higher than the conduction band edge of GaN and the conduction band edge of AlN may be even higher.

The thickness of the layers of the multilayer cap (GaN, AlN, and AlGaN) and the composition of the AlGaN can all be adjusted to obtain the improved device performance. Furthermore, as discussed above, in some embodiments of the present invention, the GaN layer may be replaced by low mole-fraction AlGaN. The mole-fraction of the AlGaN may be anywhere between 0% to the same fraction as the main AlGaN barrier layer, or possibly even higher in some embodiments.

Furthermore, in some embodiments of the present invention the AlN layer may be replaced by high mole-fraction AlGaN. This may compromise the etch stop, plus the use of a very thin barrier of only a few monolayers may be compromised in the sense that the barrier height may be lower in the immediate vicinity of a Ga site.

While embodiments of the present invention have been described herein with reference to particular HEMT structures, the present invention should not be construed as limited to such structures. For example, additional layers may be included in the HEMT device while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein. In some embodiments, insulating layers such as SiN, an ONO structure or relatively high quality AlN may be deposited for making a MISHEMT and/or passivating the surface. The additional layers may also include a compositionally graded transition layer or layers.

Furthermore, the barrier layer 22 may also be provided with multiple layers as described in U.S. Patent Publication No. 2002/0167023A1 cited above. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

While embodiments of the present invention have been described with reference to the ohmic contacts 30 being recessed through the various cap layers, in certain embodiments of the present invention, the ohmic contacts 30 are provided on the cap layer or only partially recessed into the cap layer. Thus, embodiments of the present invention should not be construed as limited to structures having ohmic contacts recessed through the cap layer.

In the drawings and specification, there have been disclosed typical embodiments of the invention, and, although specific terms have been employed, they have been used in a generic and descriptive sense only and not for purposes of limitation.

That which is claimed is:

1. A Group III-nitride high electron mobility transistor (HEMT), comprising:
   a Group III-nitride based channel layer;
   a Group III-nitride based barrier layer on the channel layer;
   a multilayer cap layer on the barrier layer, the multilayer cap layer including a layer including aluminum nitride (AlN) on the barrier layer and a gallium nitride (GaN) layer on the layer including AlN; and
   a SiN passivation layer on the GaN layer.

2. The HEMT of claim 1, wherein the layer including AlN comprises Aluminum gallium nitride (AlGaN), aluminum indium nitride (AlInN) and/or AlN.

3. The HEMT of claim 1, wherein the layer including AlN has a thickness of from about 3.0 to about 30.0 Å.

4. The HFMT of claim 1, wherein the GaN layer comprises an aluminum gallium nitride (AlGaN) layer having a low mole-fraction.

5. The HEMT of claim 4, wherein the mole-fraction of the AlGaN layer is from about zero percent of a mole-fraction of the barrier layer to about the mole-fraction of the barrier layer.

6. The HEMT of claim 5, wherein the mole-fraction of the AlGaN layer is greater than the mole-fraction of the barrier layer.

7. The HEMT of claim 1, wherein the layer including AlN comprises an aluminum gallium nitride (AlGaN) layer having a high mole-fraction.

8. A Group III-nitride high electron mobility transistor (HEMT), comprising:
   a Group III-nitride based channel layer;
   a Group III-nitride based barrier layer on the channel layer; and
   a multilayer cap layer on the barrier layer, the multilayer cap layer including an aluminum gallium nitride (AlGaN) layer on the barrier layer and an aluminum nitride (AlN) layer on the AlGaN layer.

9. The HEMT of claim 8, wherein the AlN layer has a thickness of about 10 Å.

10. The HEMT of claim 9, further comprising a gate contact that is not recessed into the multilayer cap layer and wherein a thickness of the AlGaN layer is from about 5.0 to about 50.0 Å.

11. The HEMT of claim 8, wherein the AlN layer comprises an AlGaN layer having a high mole-fraction.

12. A Group III-nitride high electron mobility transistor (HEMT), comprising:
   a Group III-nitride based channel layer;
   a Group III-nitride based barrier layer on the channel layer; and
   a multilayer cap layer on the barrier layer, the multilayer cap layer including an aluminum gallium nitride (AlGaN) layer on the barrier layer, an aluminum nitride (AlN) layer on the AlGaN layer and a gallium nitride (GaN) layer on the AlN layer.

13. The HEMT of claim 12, wherein the AlN layer has a thickness of about 10.0 Å and the GaN layer has a thickness of about 20 Å.

14. The HEMT of claim 12, wherein the HEMT has a barrier of greater than about 3.0 V.

15. The HEMT of claim 12, wherein the GaN layer comprises an AlGaN layer having a low mole-fraction.

16. The HEMT of claim 15, wherein the mole-fraction of the AlGaN layer is from about zero percent of a mole-fraction of the barrier layer to about the mole-fraction of the barrier layer.

17. The HEMT of claim 16, wherein the mole-fraction of the AlGaN layer is greater than the mole-fraction of the barrier layer.

18. The HEMT of claim 12, wherein the AlN layer comprises an AlGaN layer having a high mole-fraction.

* * * * *

UNITED STATES PATENT AND TRADEMARK OFFICE
CERTIFICATE OF CORRECTION

PATENT NO. : 7,709,859 B2  
APPLICATION NO. : 11/684747  
DATED : May 4, 2010  
INVENTOR(S) : Smith et al.

Page 1 of 1

It is certified that error appears in the above-identified patent and that said Letters Patent is hereby corrected as shown below:

Title Page, Item (56) References Cited, U.S. Patent Documents, Page 2, left column:
Please include -- 7,085,552   8/2006 --

U.S. Patent Documents, Page 2, right column:
Please include -- 2006/02581451   11/2006   Yang --

In the Claims:
Column 21, Claim 4, Line 21: Please correct "HFMT" to read -- HEMT --

Signed and Sealed this
Fifteenth Day of May, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,709,859 B2 | Page 1 of 1 |
| APPLICATION NO. | : 11/684747 | |
| DATED | : May 4, 2010 | |
| INVENTOR(S) | : Smith et al. | |

It is certified that error appears in the above-identified patent and that said Letters Patent is hereby corrected as shown below:

Title Page, Item (56) References Cited, U.S. Patent Documents, Page 2, left column:
Please include -- 7,085,552   8/2006 --

U.S. Patent Documents, Page 2, right column:
Please include -- 2006/0258451   11/2006   Yang --

In the Claims:
Column 21, Claim 4, Line 21: Please correct "HFMT" to read -- HEMT --

This certificate supersedes the Certificate of Correction issued May 15, 2012.

Signed and Sealed this
Nineteenth Day of June, 2012

David J. Kappos
*Director of the United States Patent and Trademark Office*